United States Patent
Freeman et al.

(10) Patent No.: US 10,366,901 B2
(45) Date of Patent: Jul. 30, 2019

(54) INTEGRATED STRUCTURES, CAPACITORS AND METHODS OF FORMING CAPACITORS

(71) Applicant: Micron Technology, Inc., Boise, ID (US)

(72) Inventors: Eric Freeman, Kuna, ID (US); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/451,090

(22) Filed: Mar. 6, 2017

(65) Prior Publication Data

US 2018/0254283 A1 Sep. 6, 2018

(51) Int. Cl.
| | |
|---|---|
| *H01L 21/311* | (2006.01) |
| *H01L 49/02* | (2006.01) |
| *H01L 23/522* | (2006.01) |
| *H01L 27/11582* | (2017.01) |

(52) U.S. Cl.
CPC .... *H01L 21/31111* (2013.01); *H01L 23/5223* (2013.01); *H01L 27/11582* (2013.01); *H01L 28/60* (2013.01); *H01L 28/86* (2013.01); *H01L 28/90* (2013.01)

(58) Field of Classification Search
CPC ......... H01L 27/11529; H01L 27/11531; H01L 27/11573; H01L 21/31111; H01L 28/60
See application file for complete search history.

(56) References Cited

U.S. PATENT DOCUMENTS

| | | | |
|---|---|---|---|
| 8,343,845 B2 | 1/2013 | Kim et al. | |
| 8,394,716 B2 | 3/2013 | Hwang et al. | |
| 9,136,317 B1* | 9/2015 | Mao | ........................ H01L 28/60 |
| 2010/0177459 A1* | 7/2010 | Wu | .................... H01L 27/10852 361/303 |
| 2010/0240179 A1 | 9/2010 | Kim et al. | |
| 2013/0126957 A1 | 5/2013 | Higashitani et al. | |

FOREIGN PATENT DOCUMENTS

| | | |
|---|---|---|
| TW | 225601 | 6/1994 |
| TW | I480905 | 4/2015 |
| TW | 107107313 | 10/2018 |

\* cited by examiner

*Primary Examiner* — Andrew Q Tran
(74) *Attorney, Agent, or Firm* — Wells St. John P.S.

(57) ABSTRACT

Some embodiments include an integrated structure having a semiconductor base and an insulative frame over the semiconductor base. The insulative frame has vertically-spaced sheets of first insulative material, and pillars of second insulative material between the vertically-spaced sheets. The first and second insulative materials are different from one another. Conductive plates are between the vertically-spaced sheets and are directly against the insulative pillars. Some embodiments include capacitors, and some embodiments include methods of forming capacitors.

12 Claims, 36 Drawing Sheets

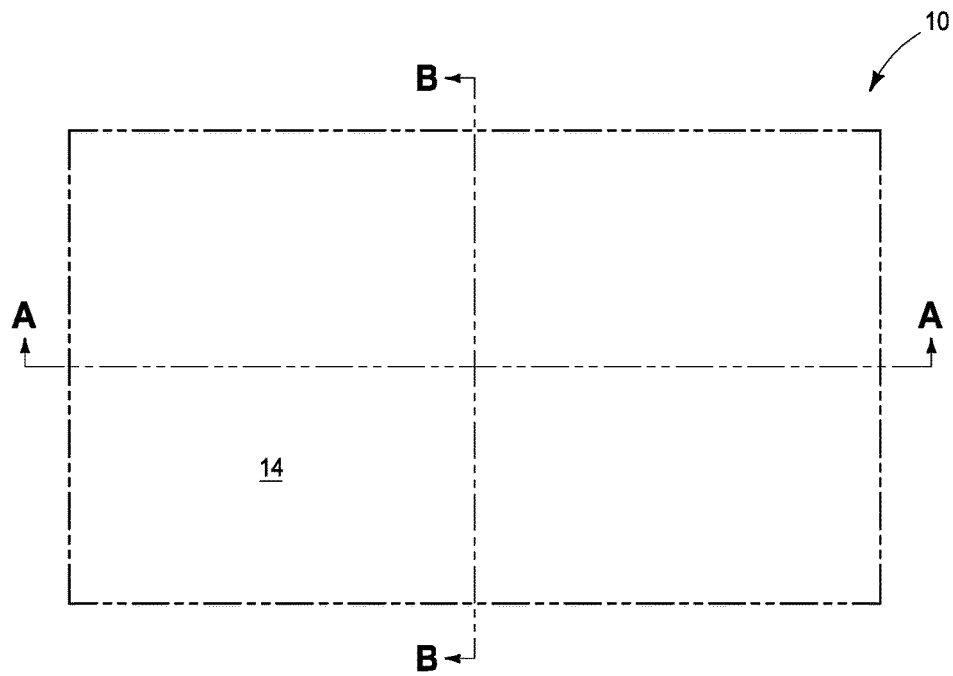
FIG. 1 (C-C)
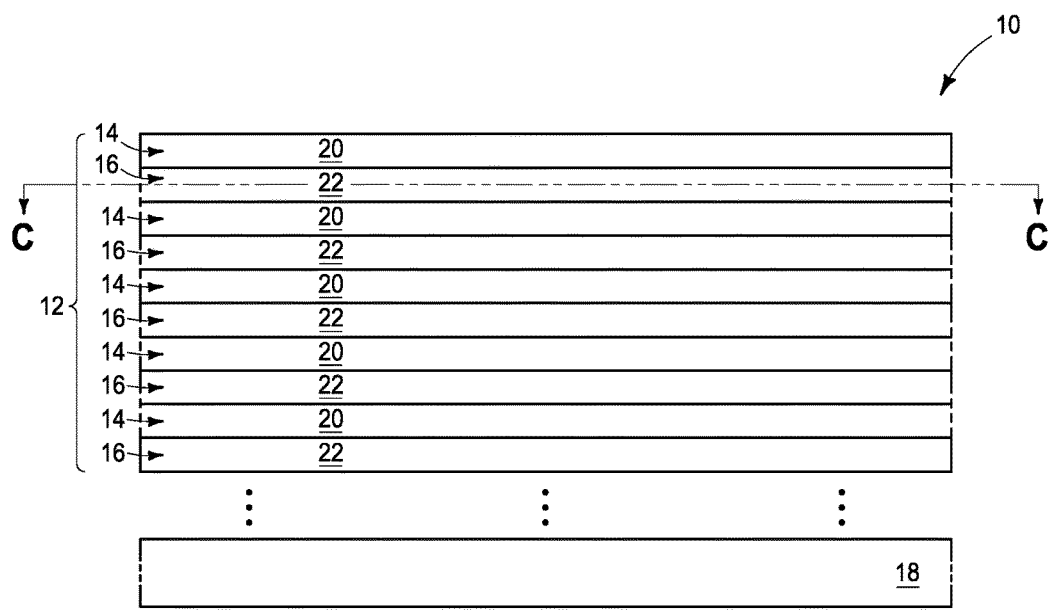
FIG. 2 (A-A)

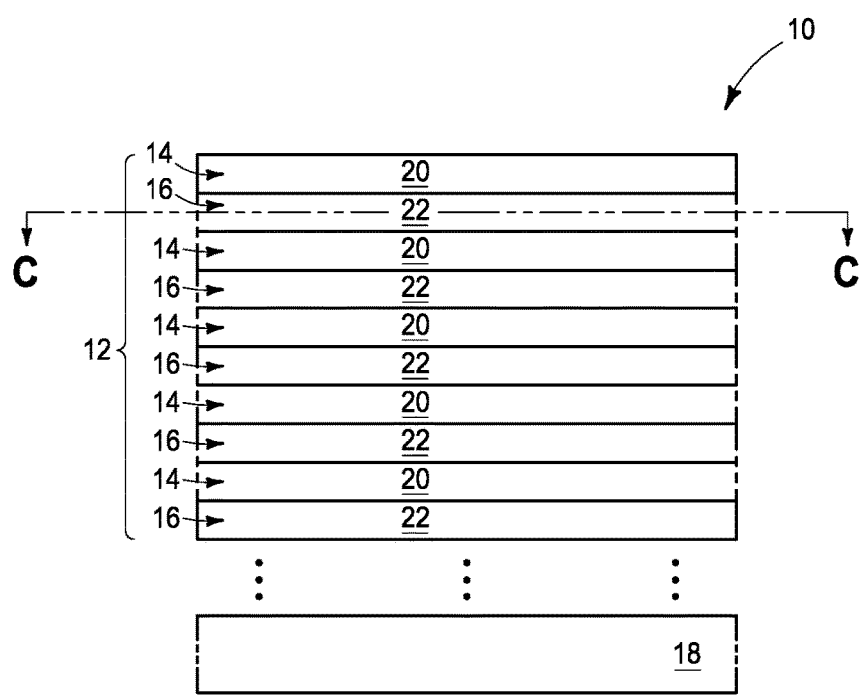
FIG. 3 (B-B)

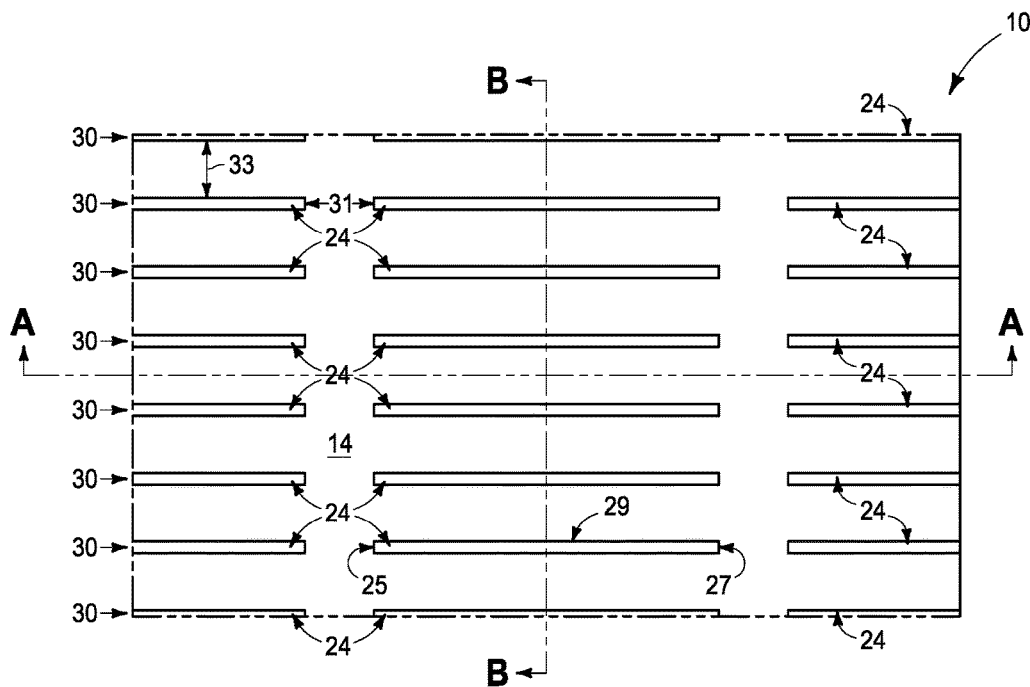
FIG. 4 (C-C)
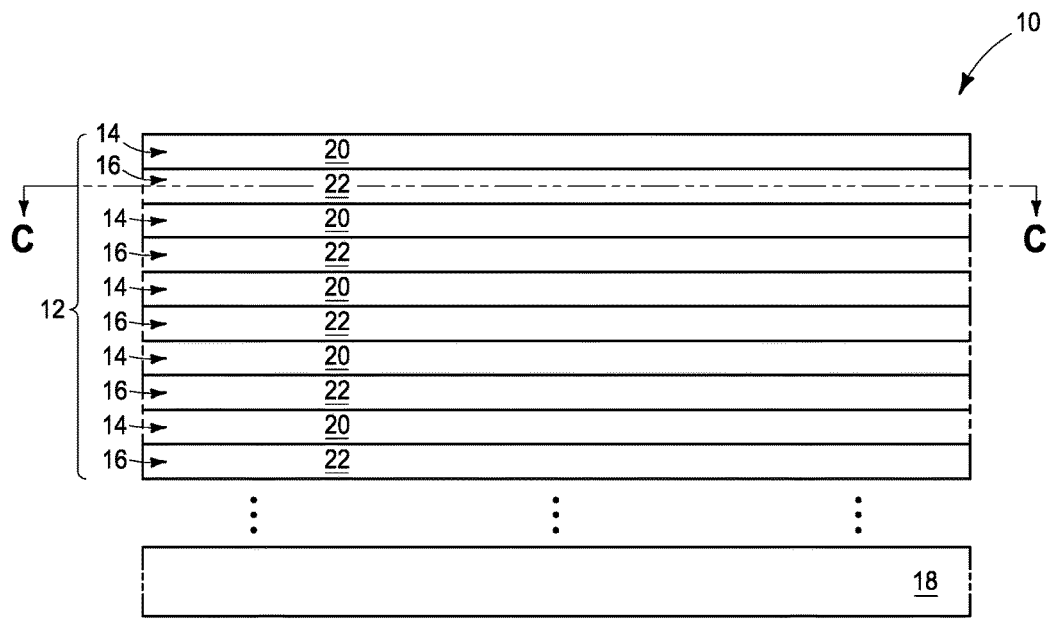
FIG. 5 (A-A)

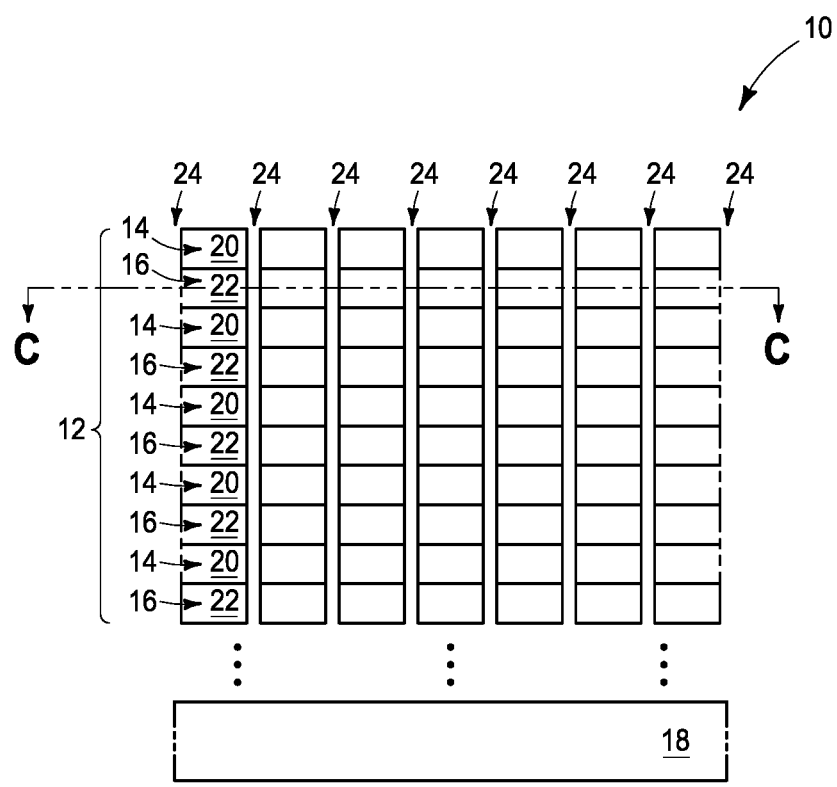
FIG. 6 (B-B)

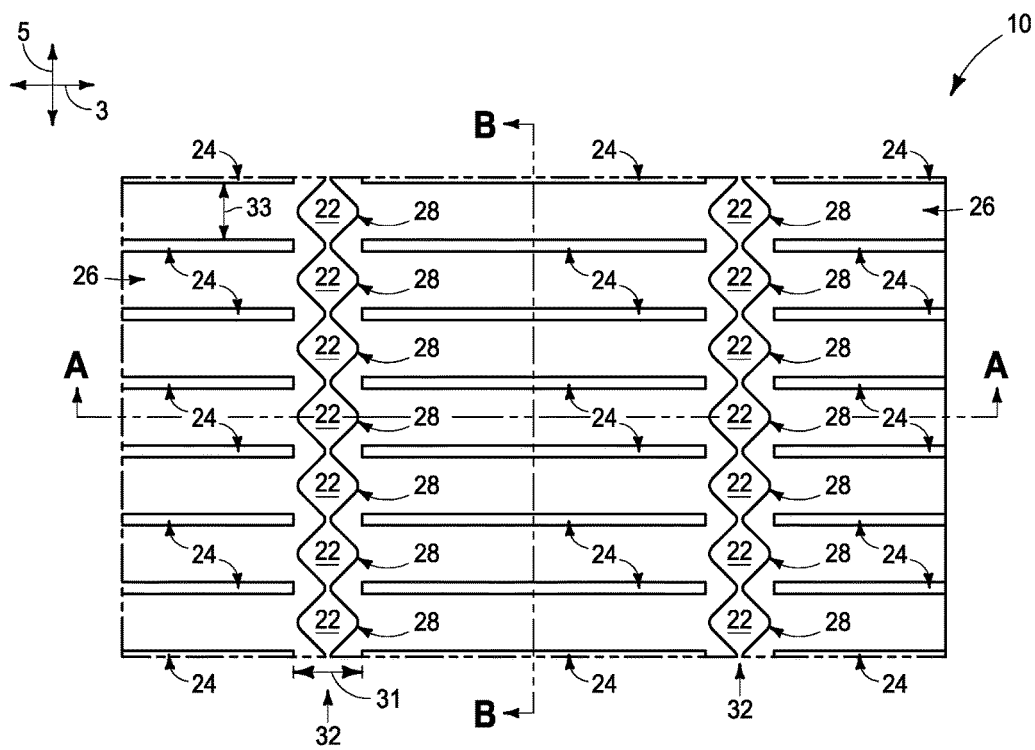
FIG. 7 (C-C)
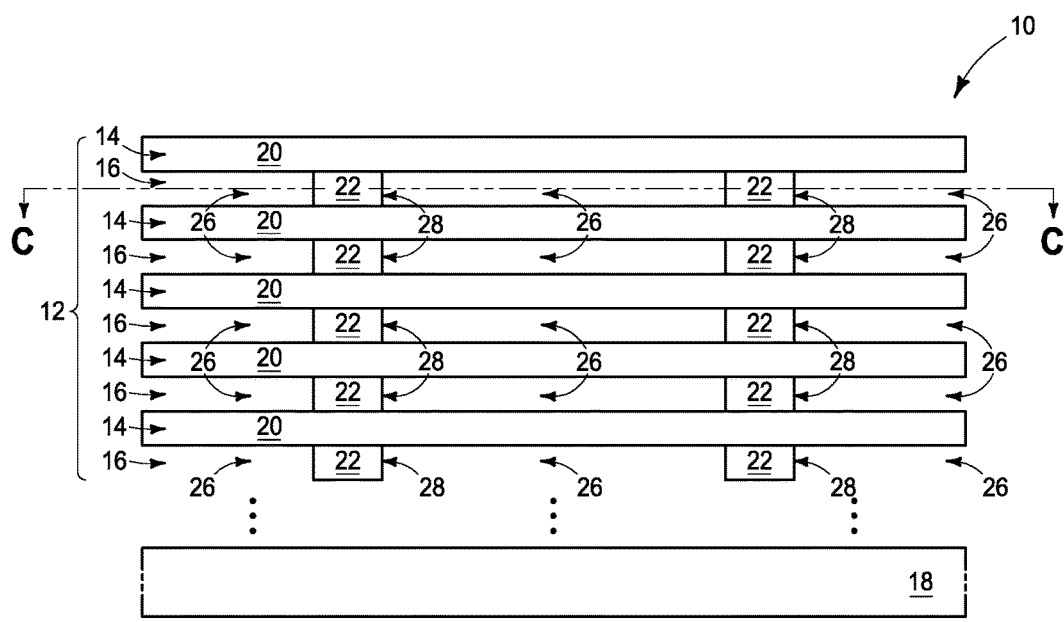
FIG. 8 (A-A)

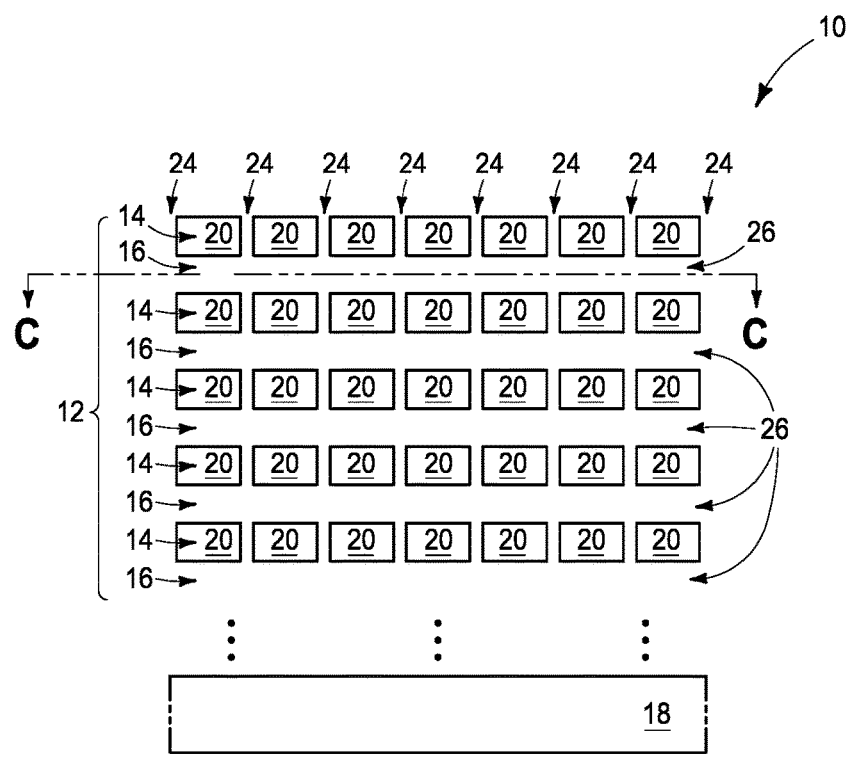
FIG. 9 (B-B)

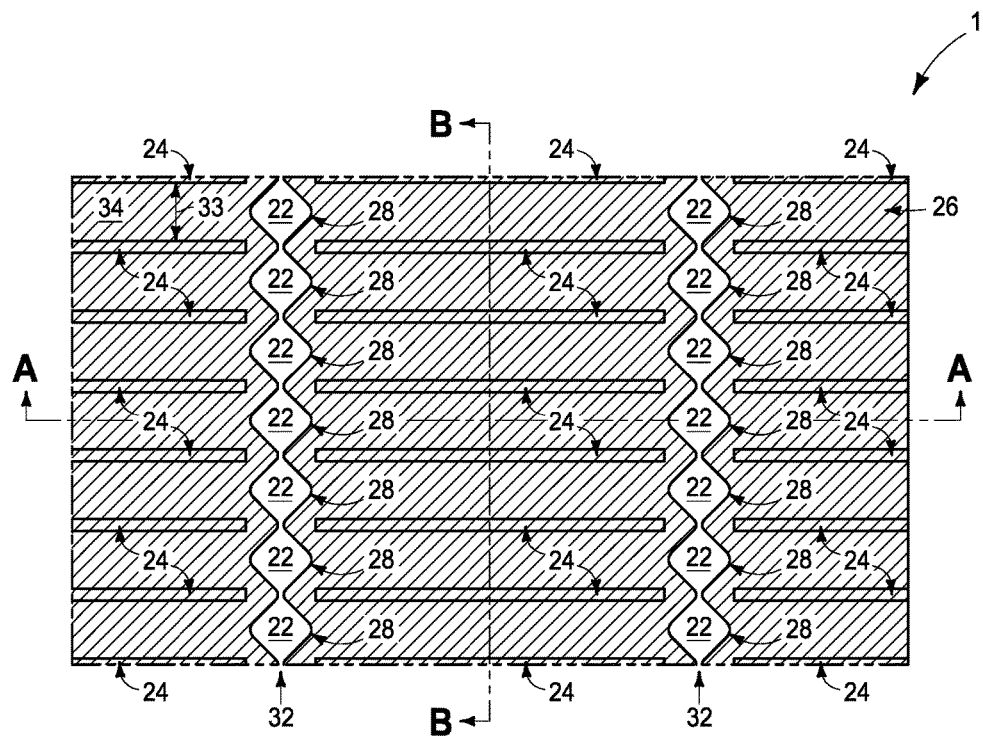
FIG. 10 (C-C)
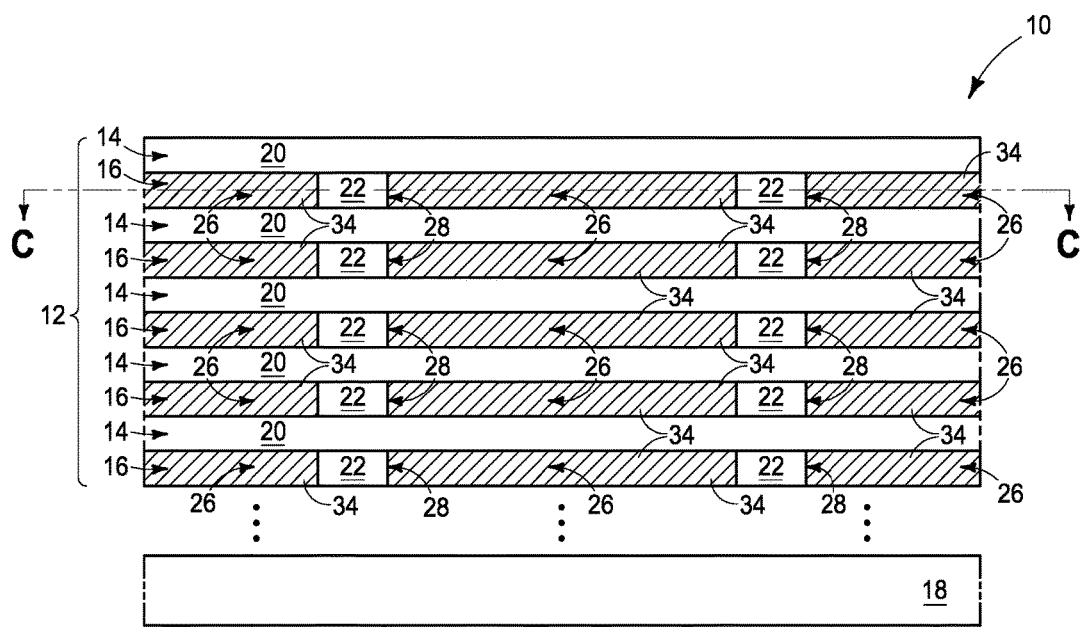
FIG. 11 (A-A)

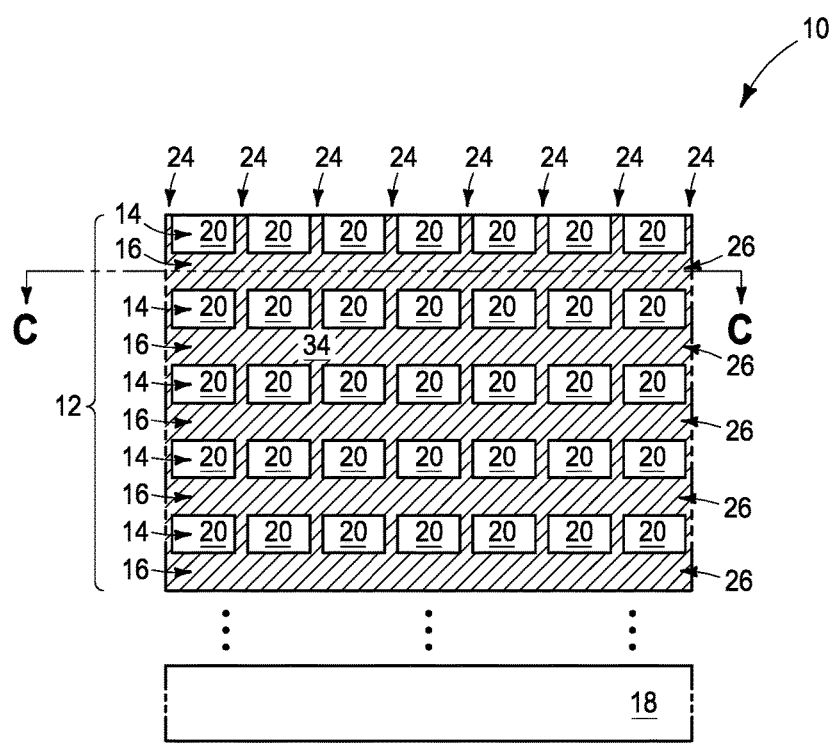
FIG. 12 (B-B)

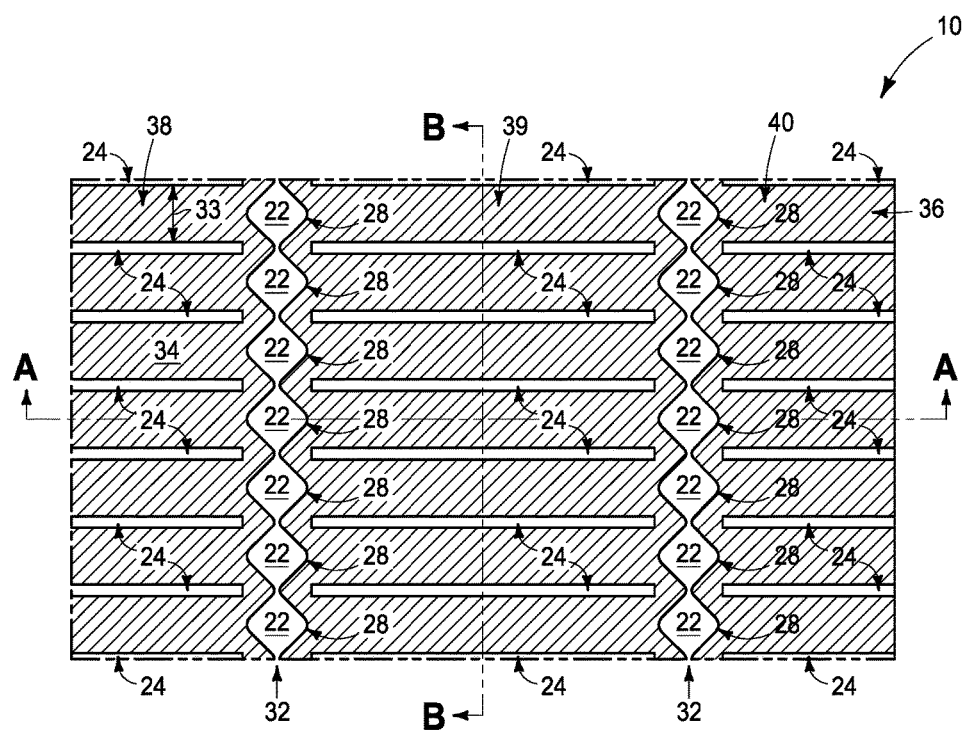
FIG. 13 (C-C)
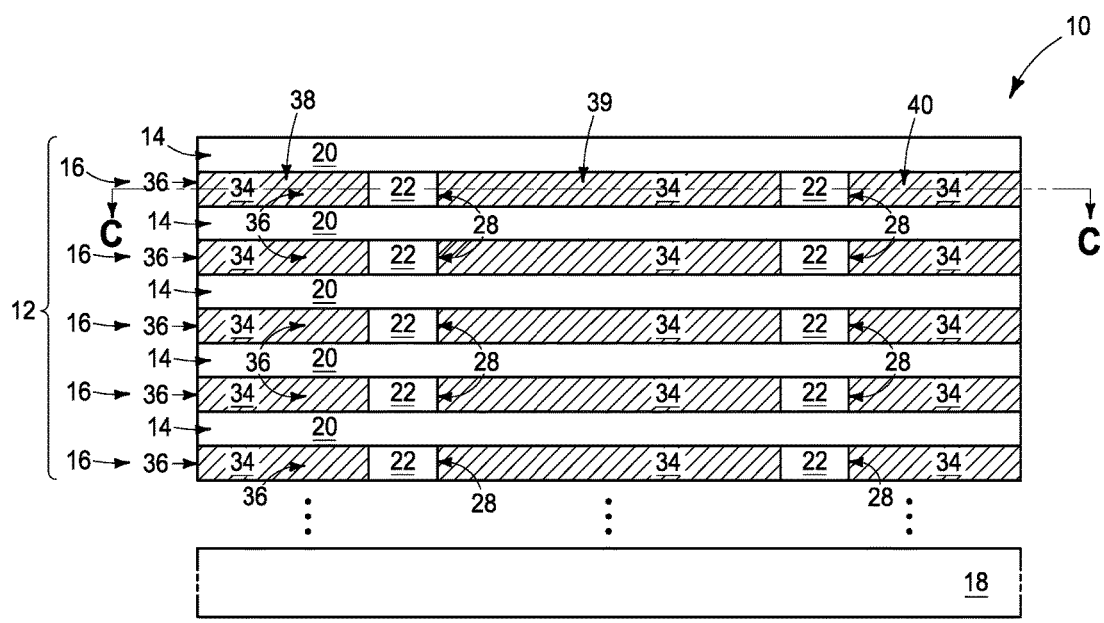
FIG. 14 (A-A)

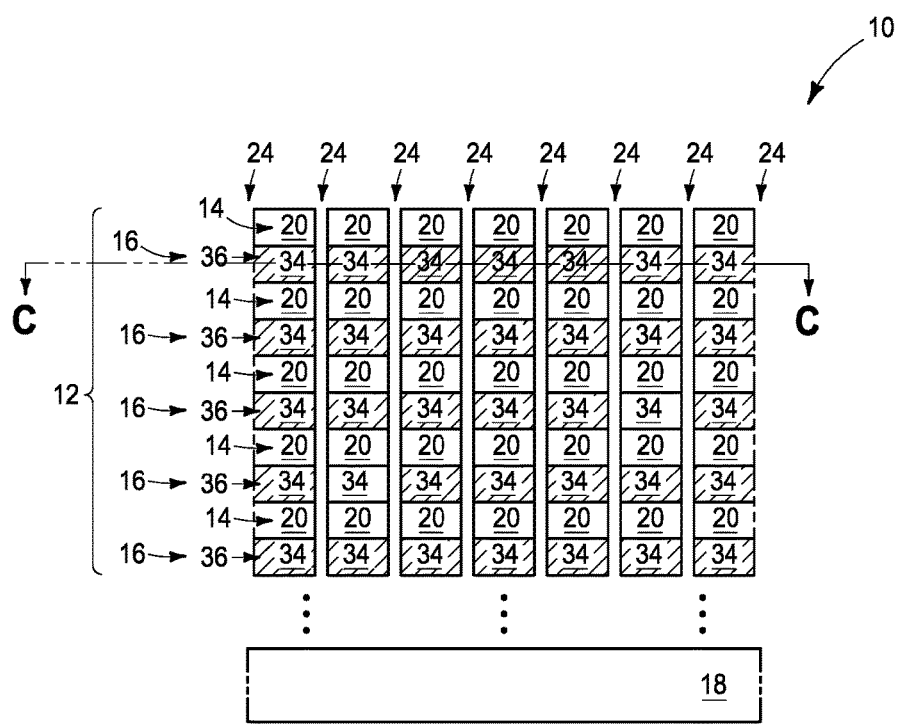
FIG. 15 (B-B)

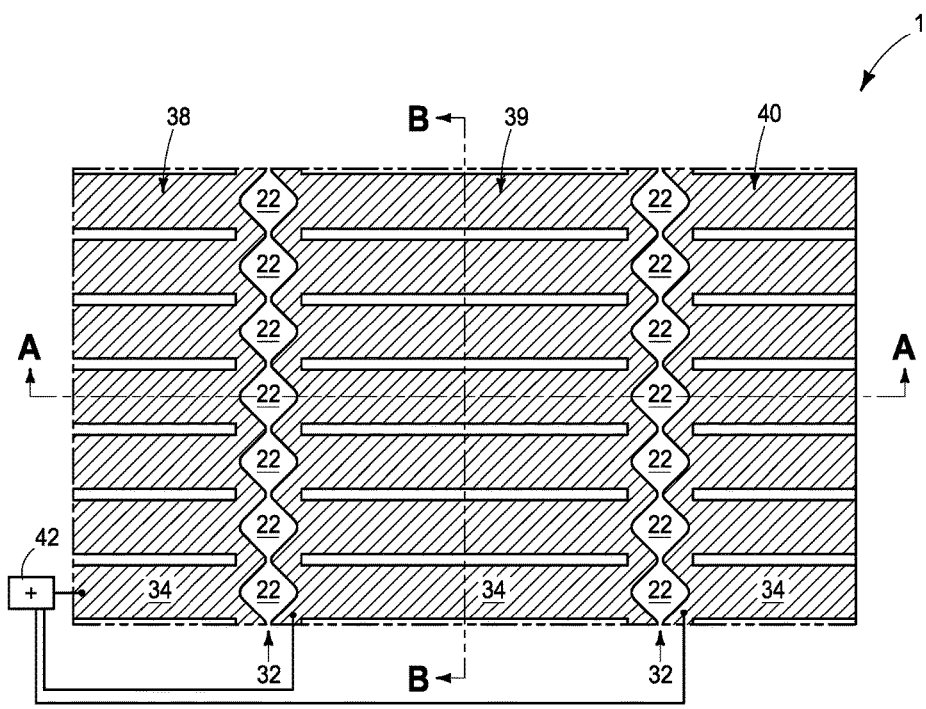
FIG. 16 (C-C)
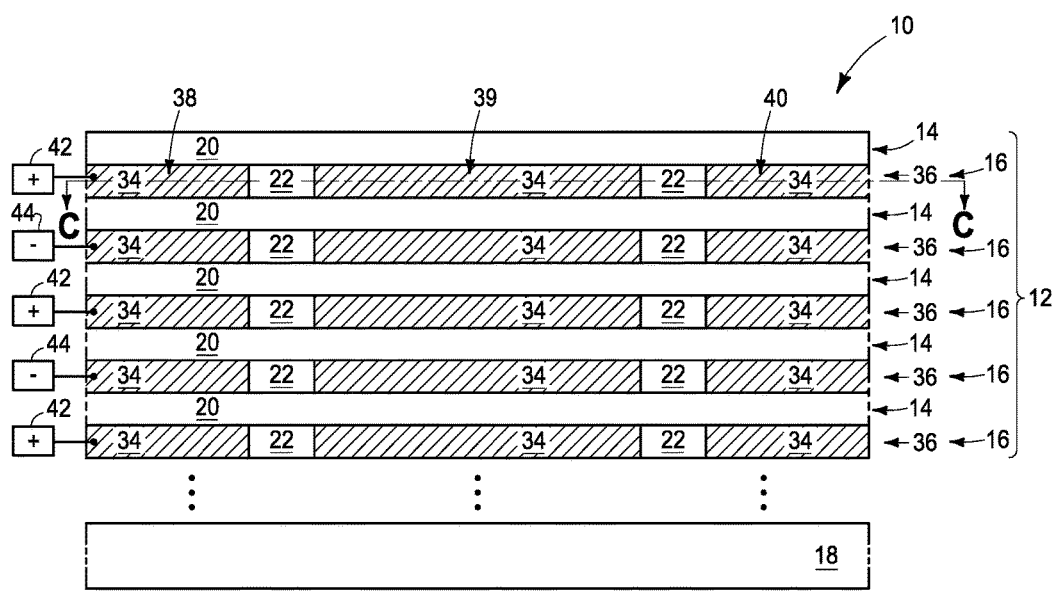
FIG. 17 (A-A)

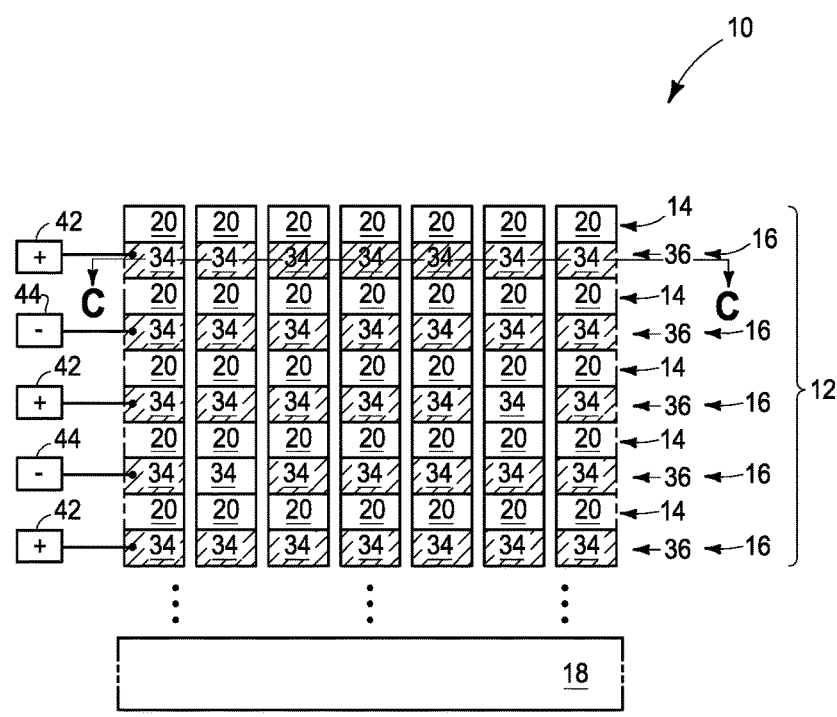
FIG. 18 (B-B)

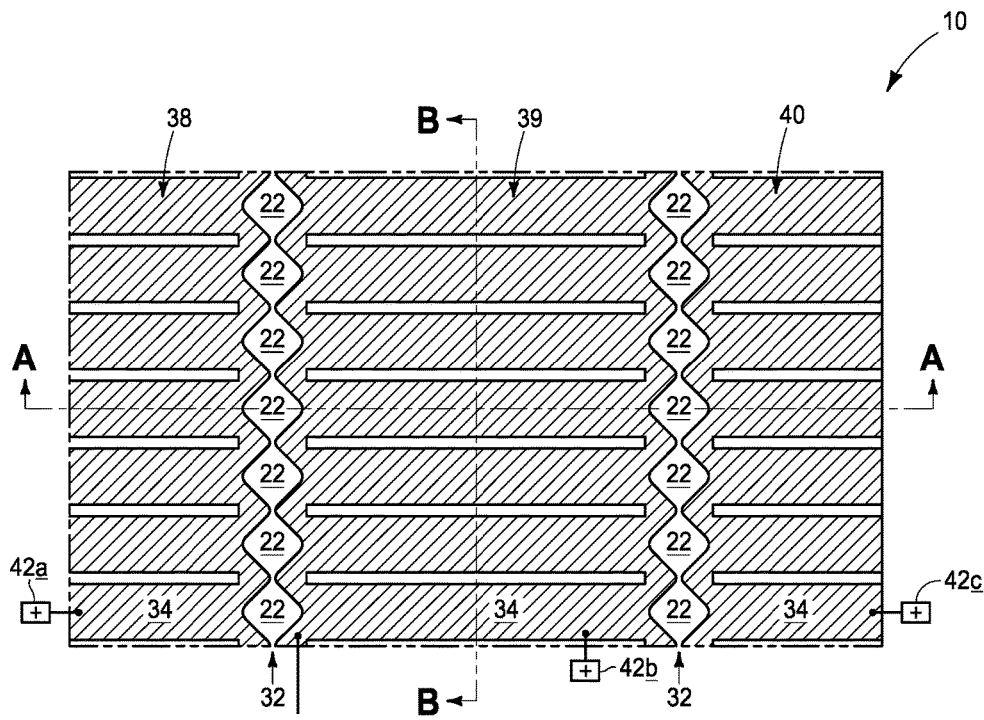
FIG. 19 (C-C)
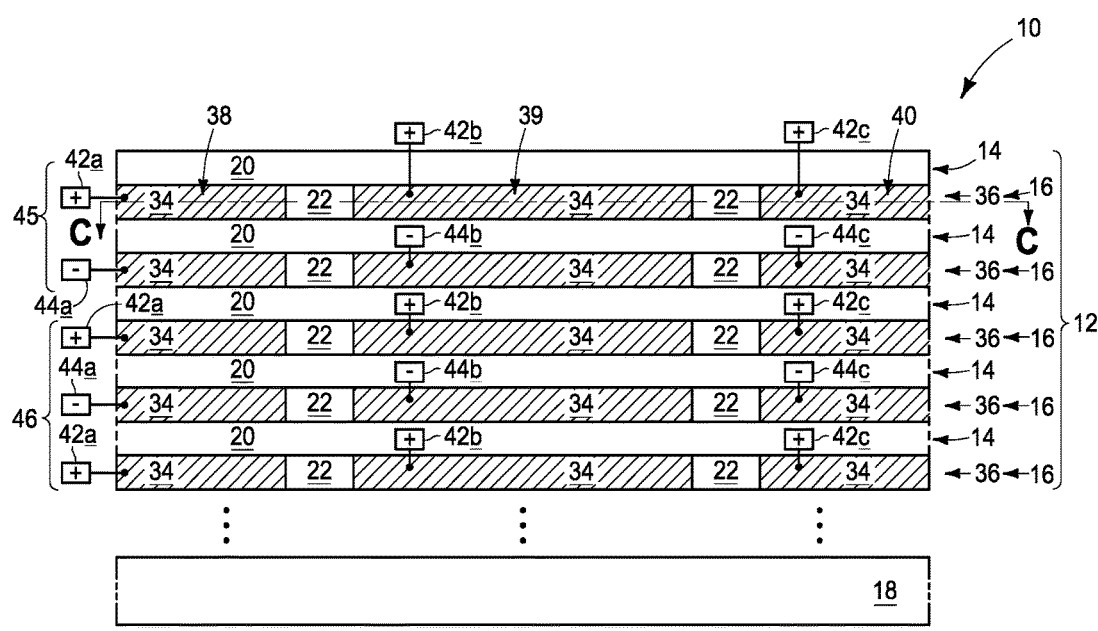
FIG. 20 (A-A)

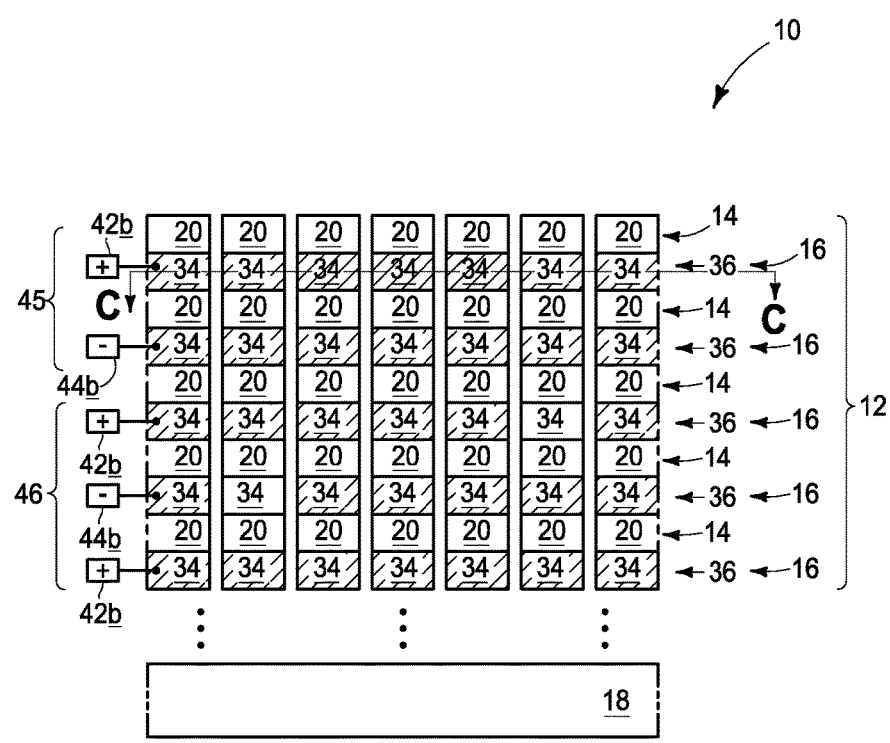
FIG. 21 (B-B)

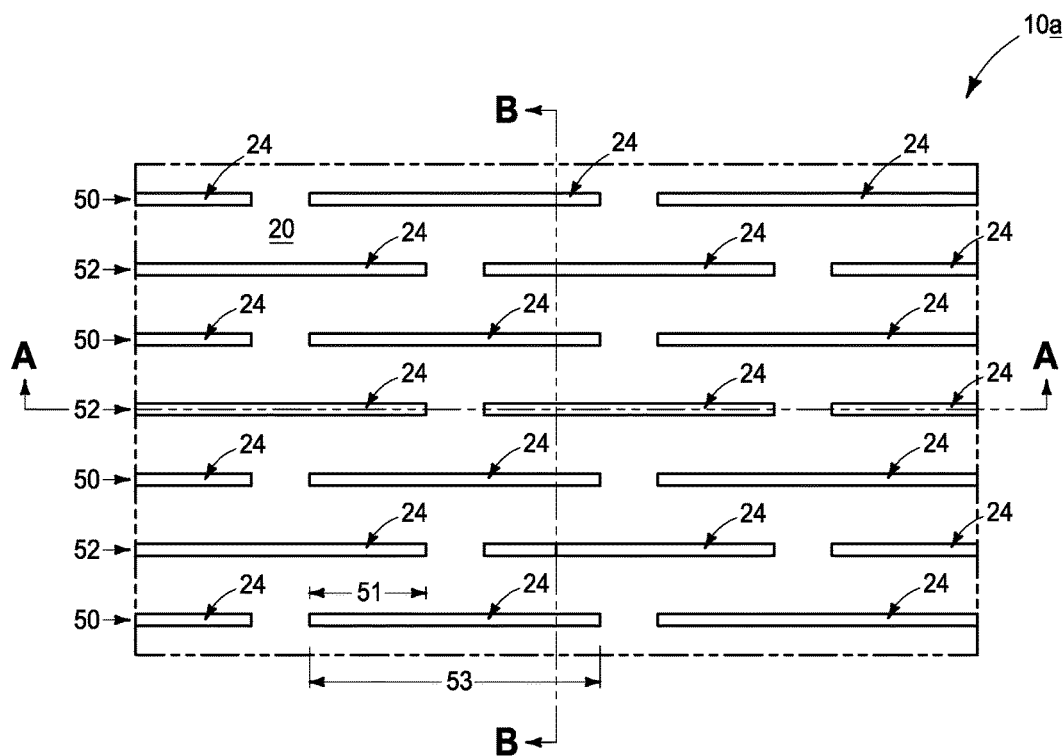
FIG. 22 (C-C)
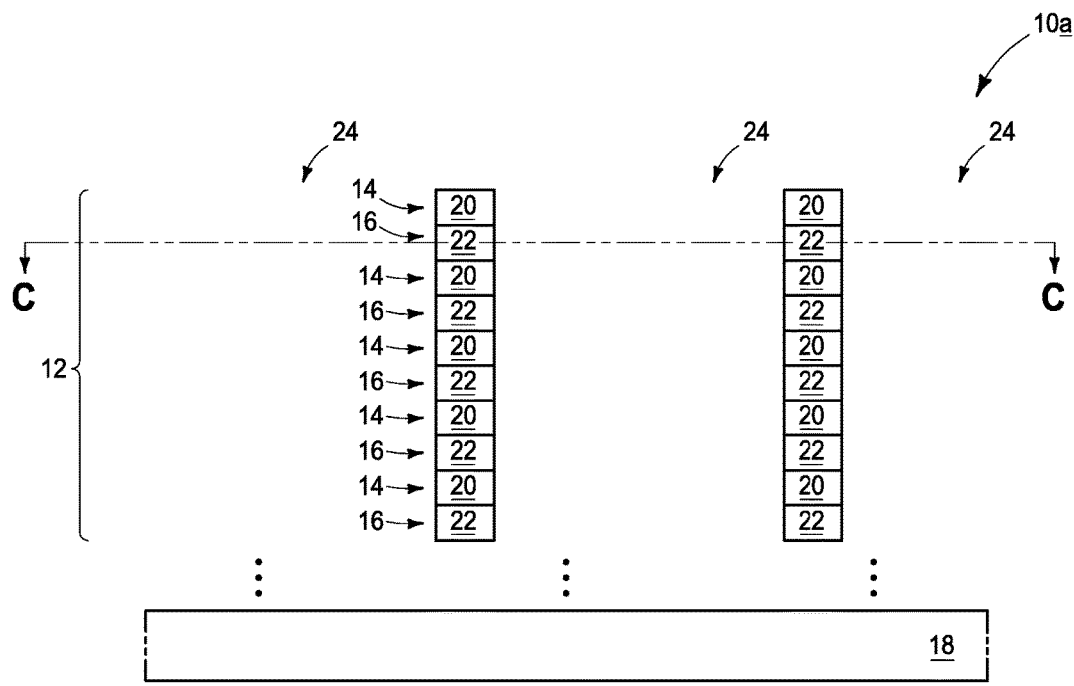
FIG. 23 (A-A)

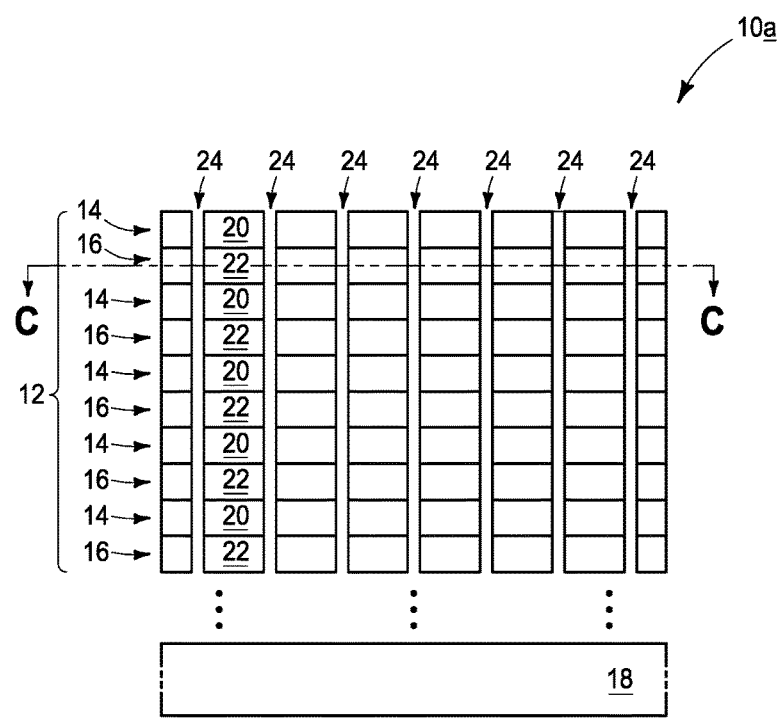
FIG. 24 (B-B)

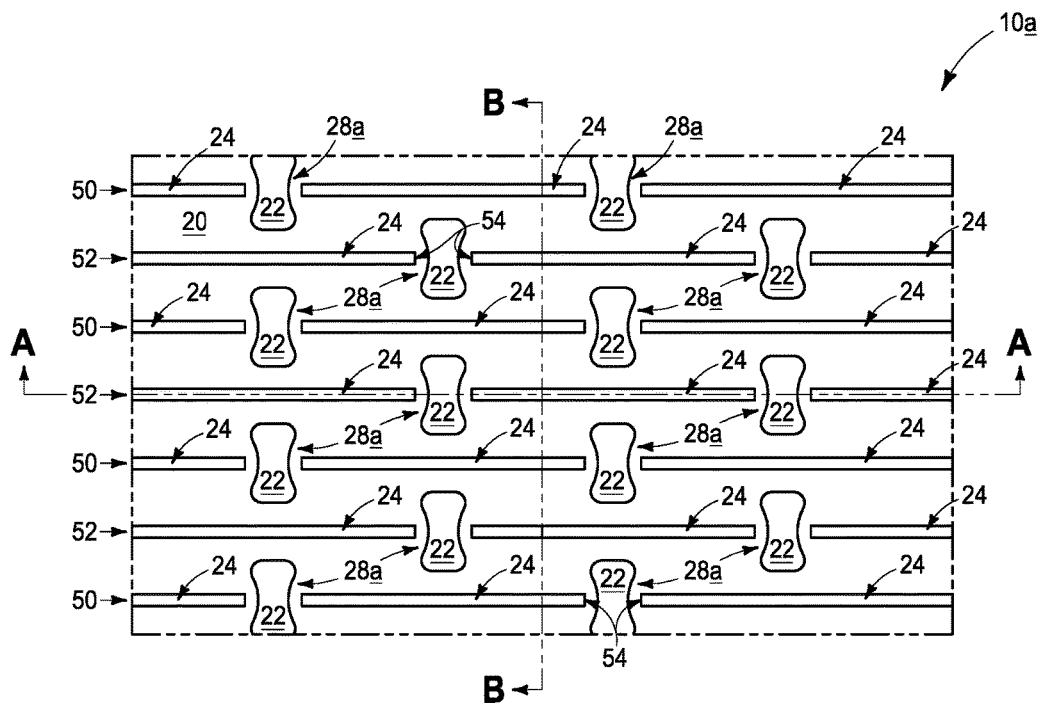
FIG. 25 (C-C)
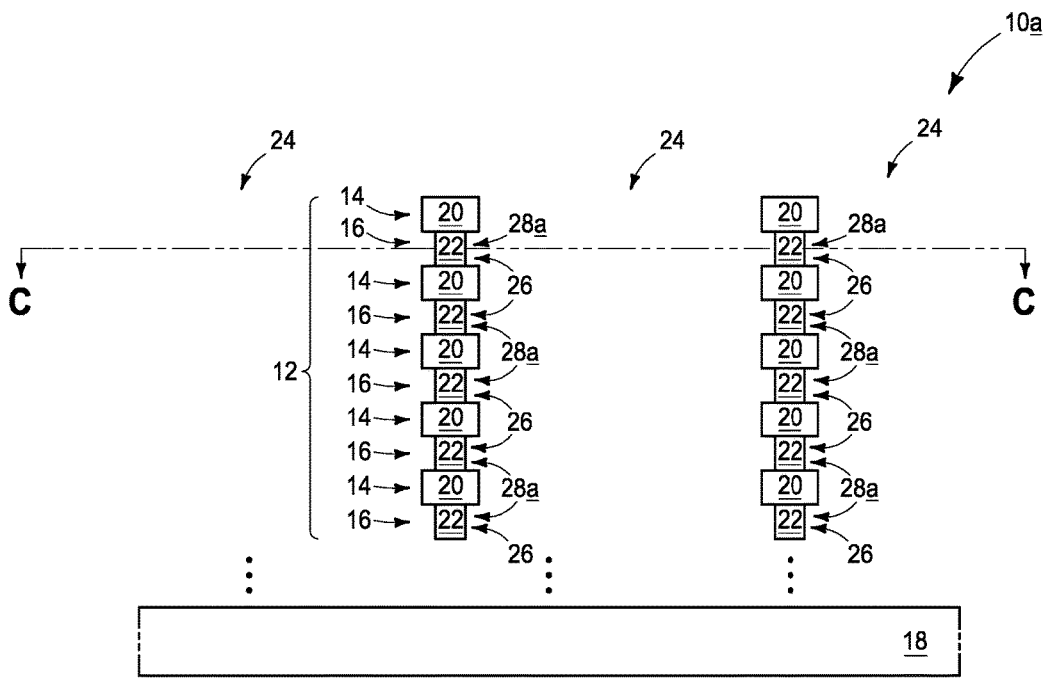
FIG. 26 (A-A)

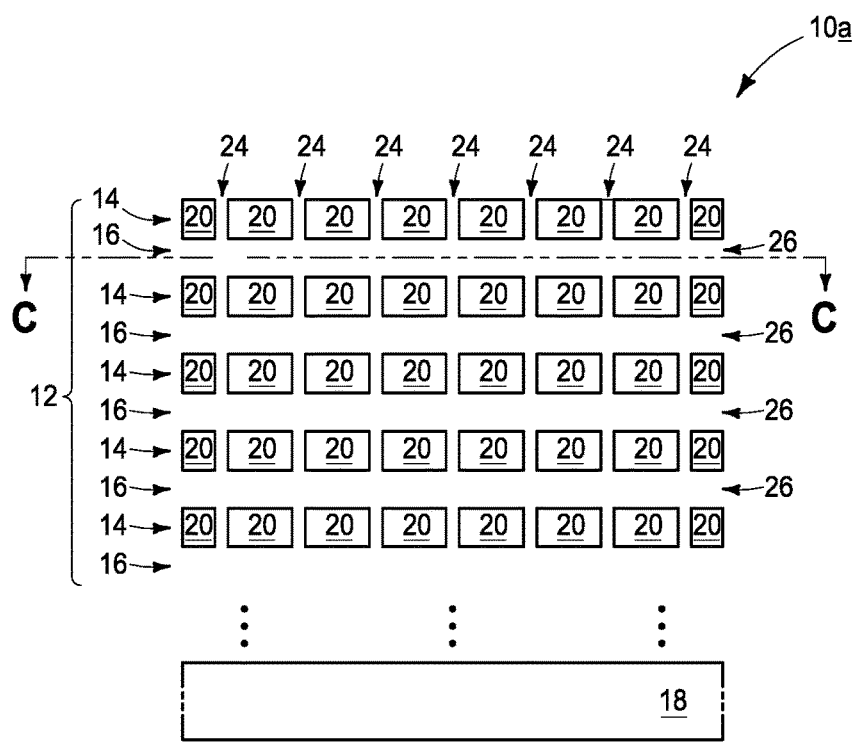
FIG. 27 (B-B)

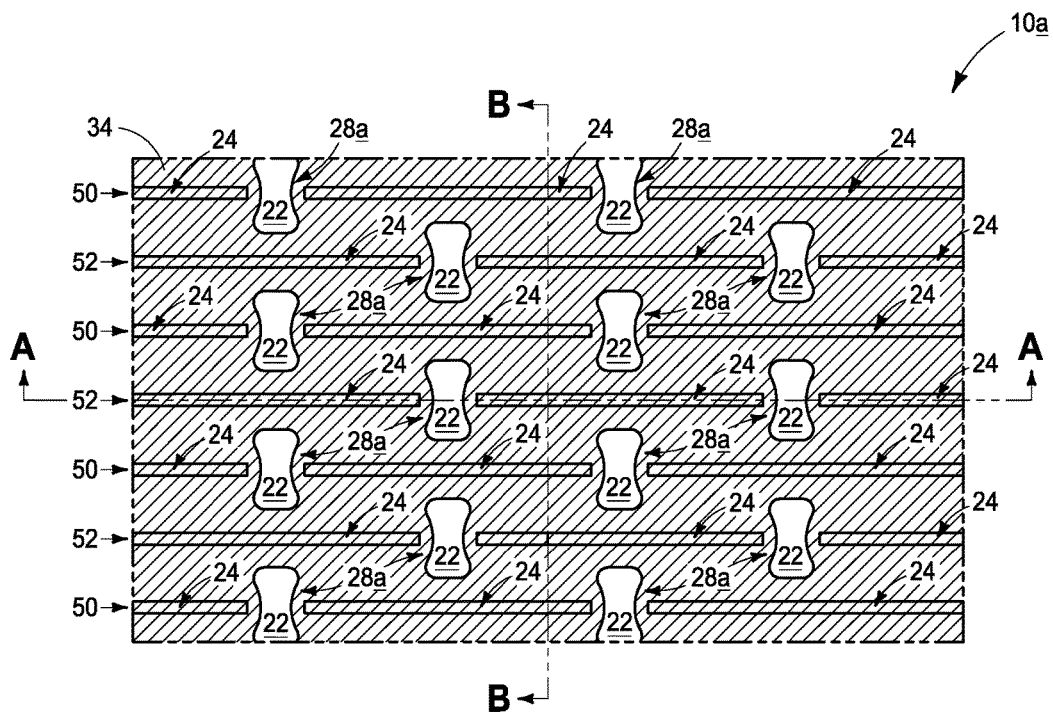
FIG. 28 (C-C)
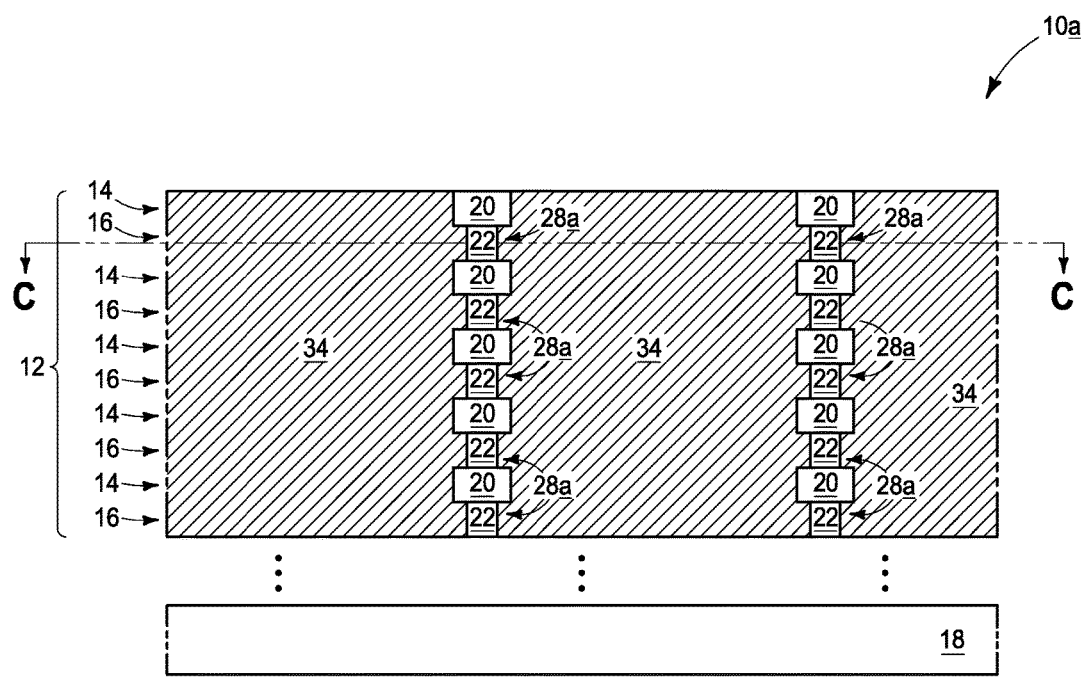
FIG. 29 (A-A)

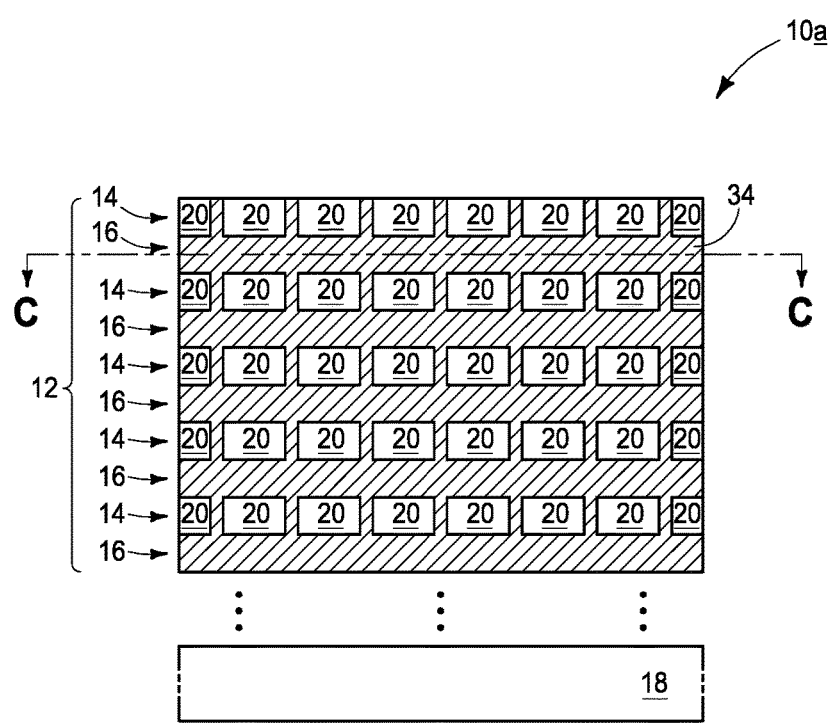
FIG. 30 (B-B)

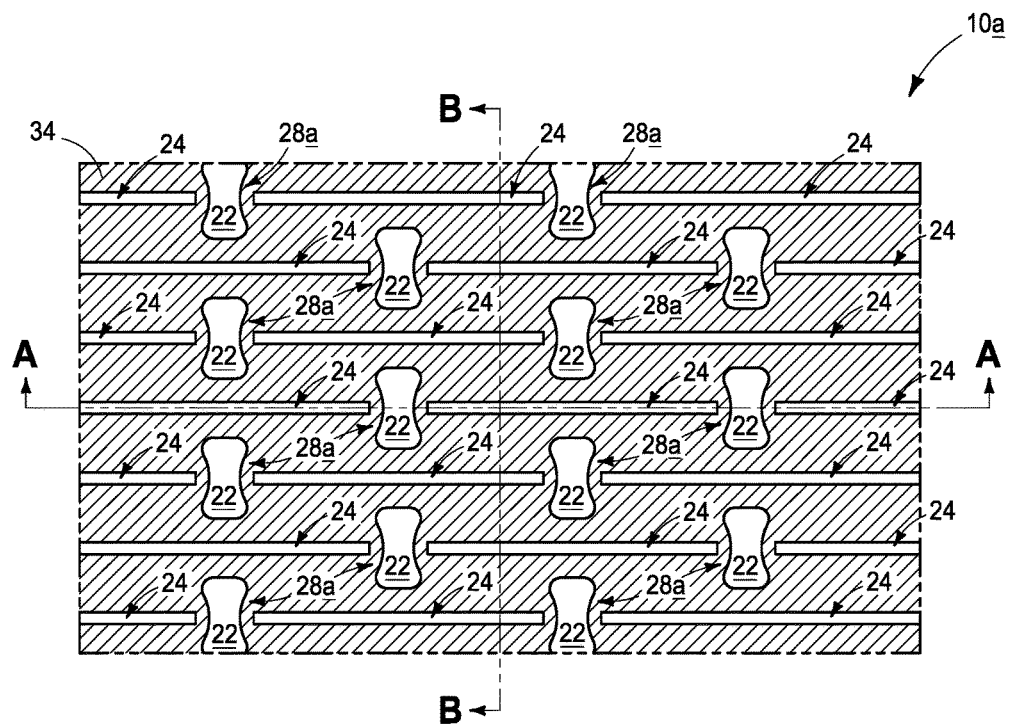
FIG. 31 (C-C)
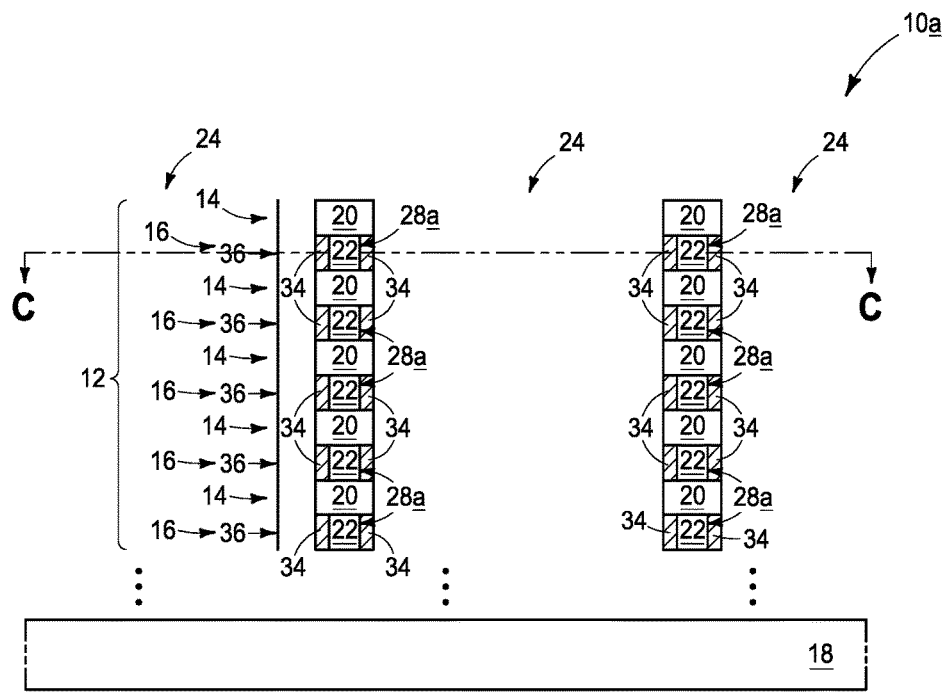
FIG. 32 (A-A)

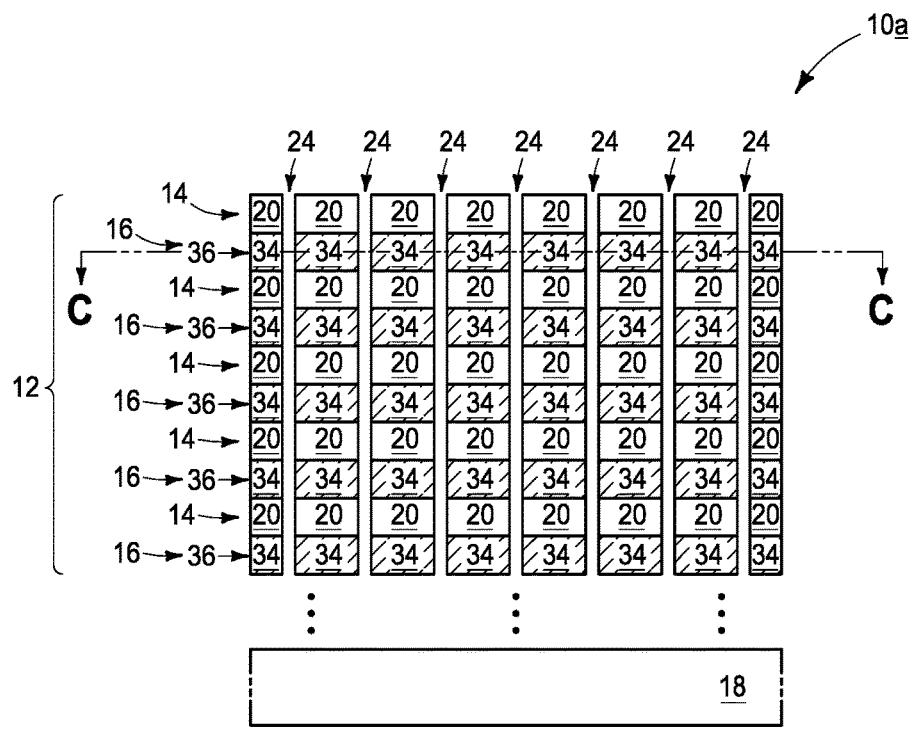
FIG. 33 (B-B)

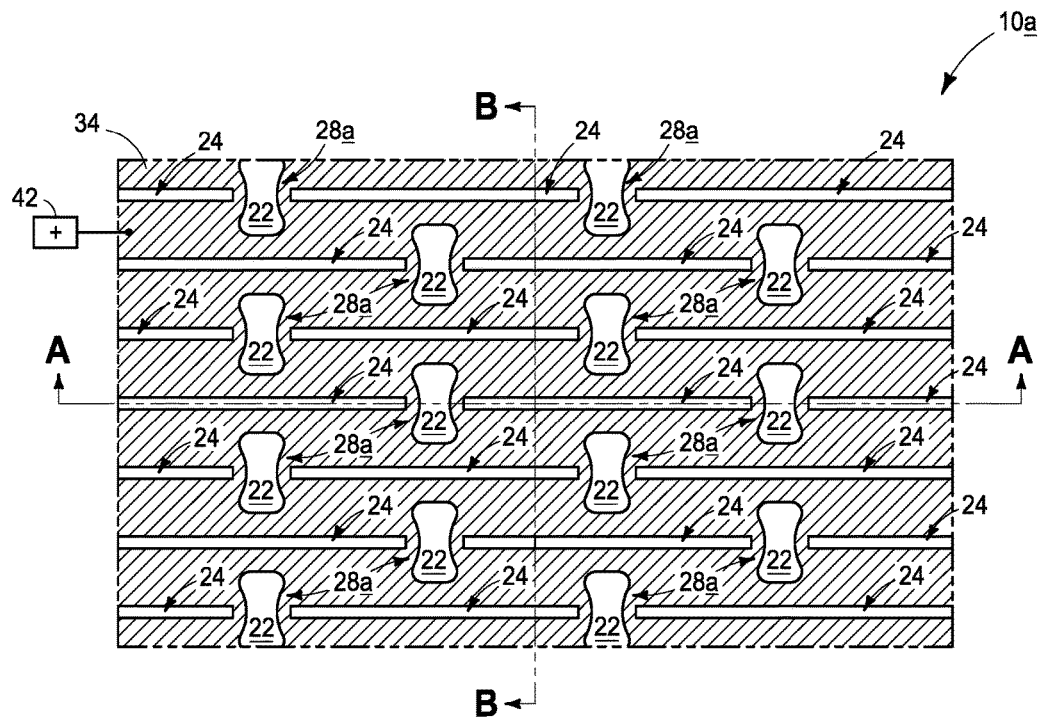
FIG. 34 (C-C)
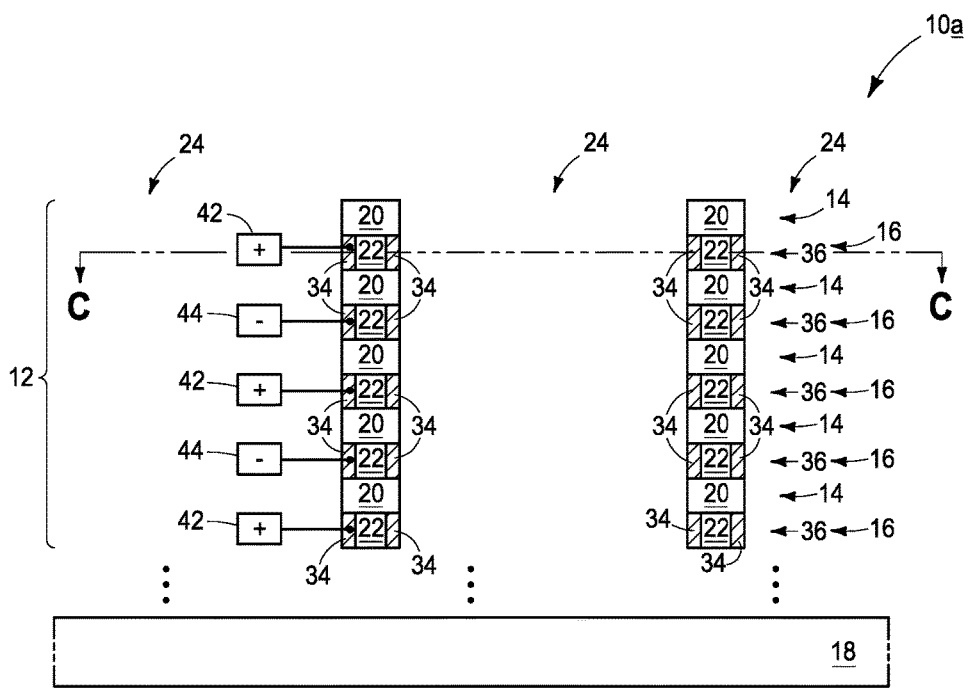
FIG. 35 (A-A)

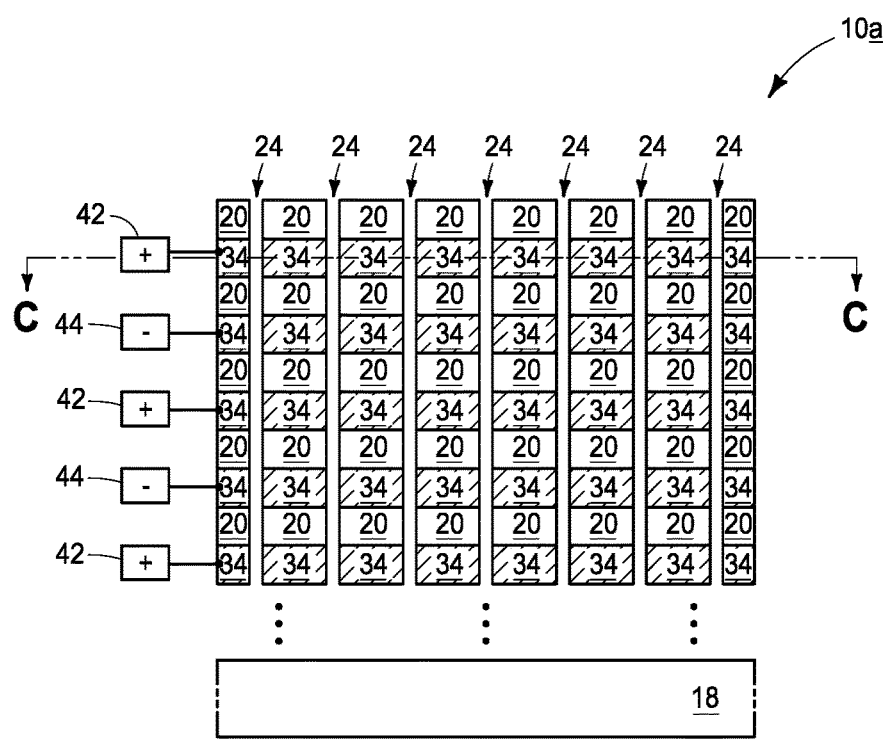
FIG. 36 (B-B)

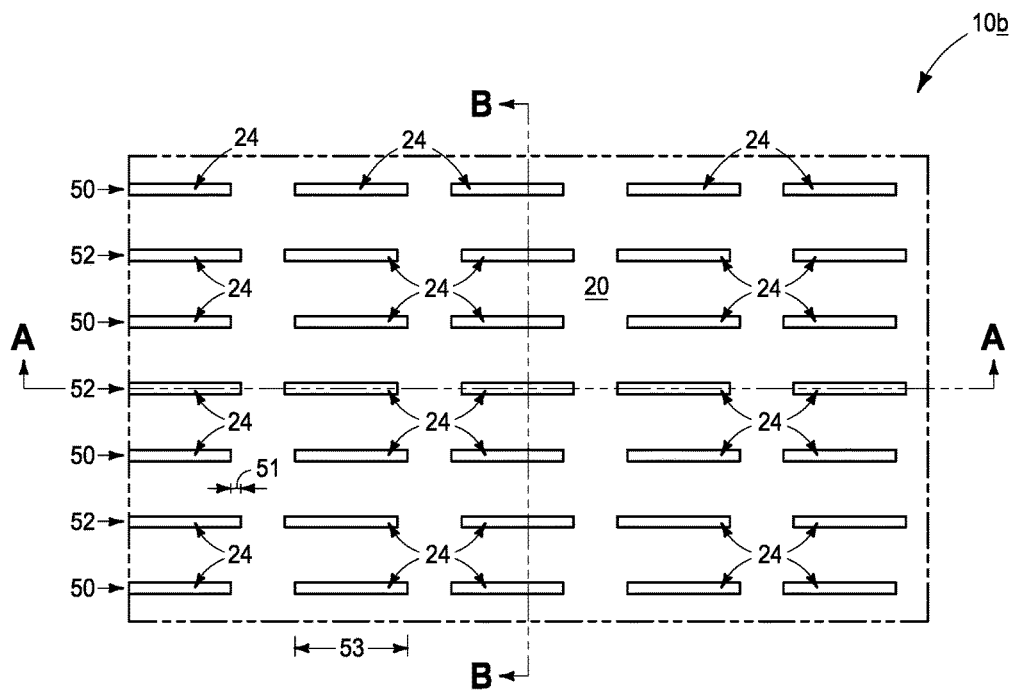
FIG. 37 (C-C)
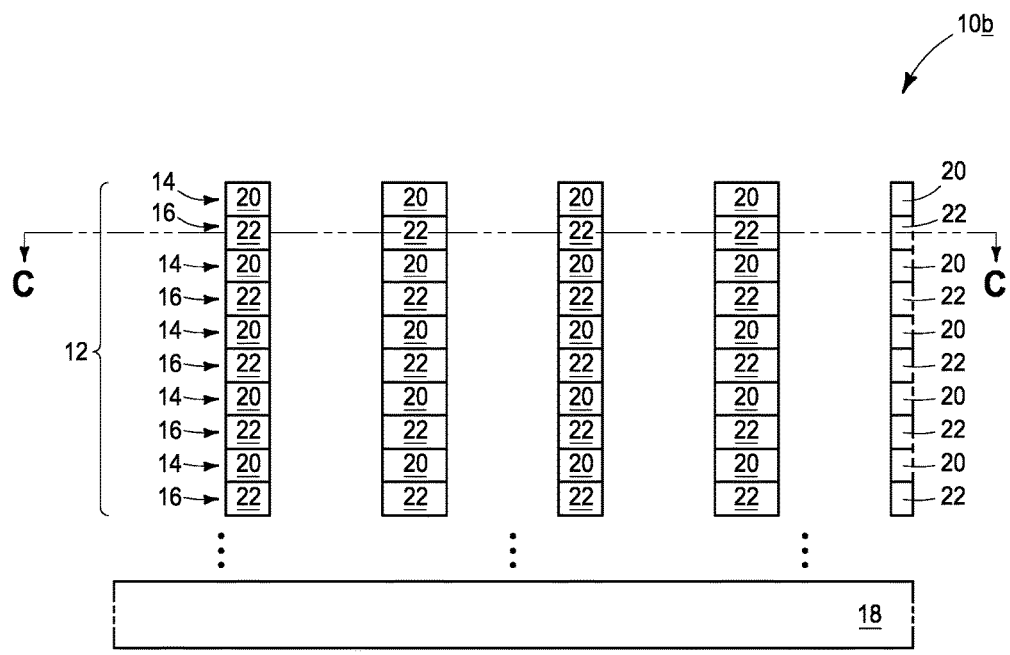
FIG. 38 (A-A)

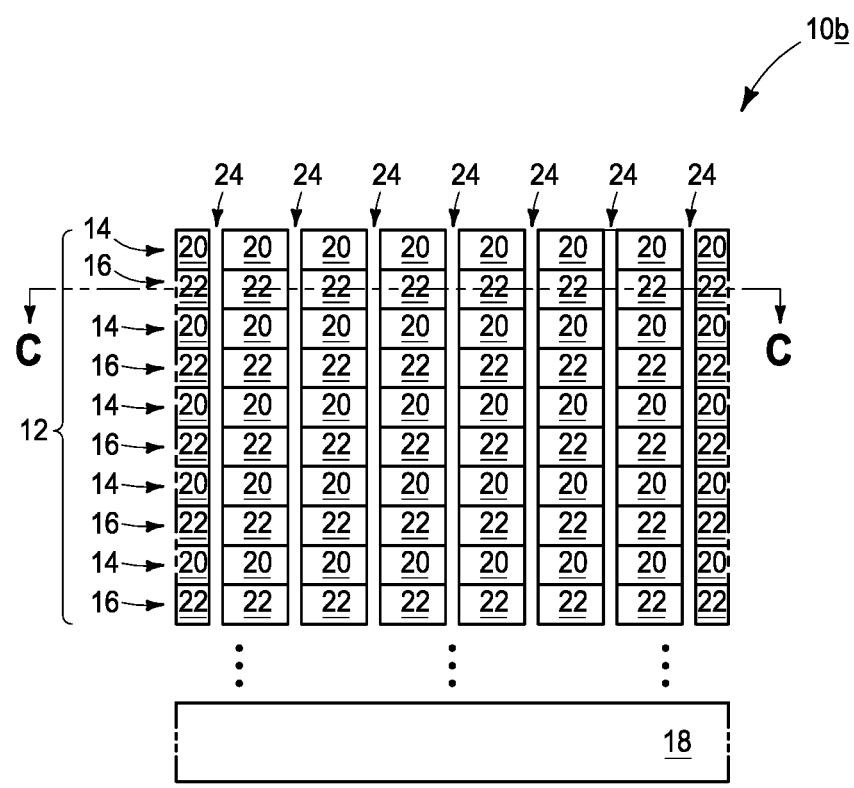
FIG. 39 (B-B)

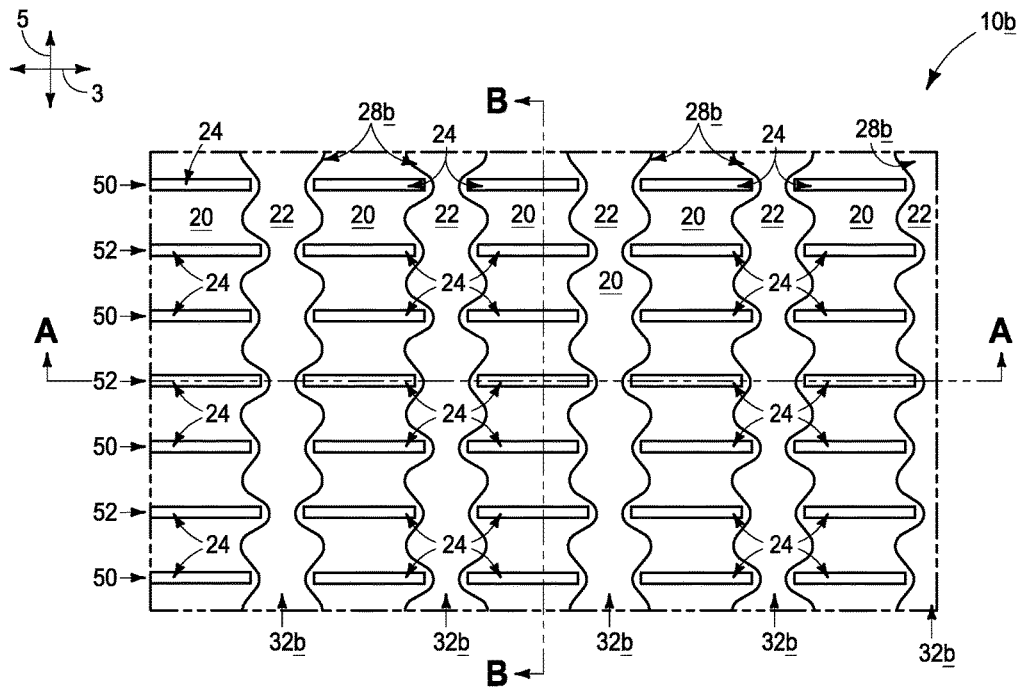
FIG. 40 (C-C)
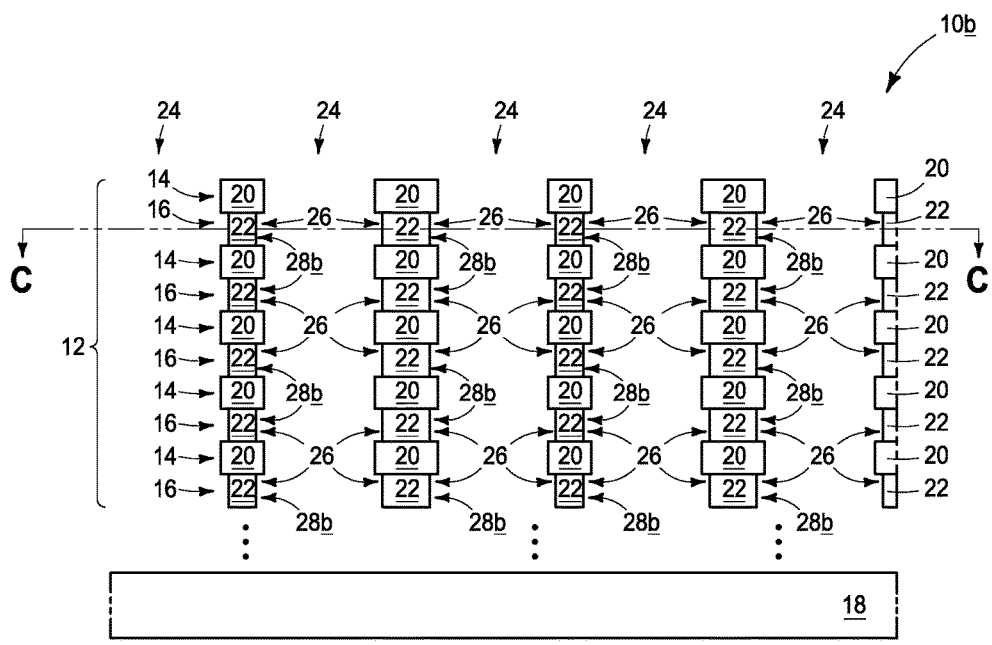
FIG. 41 (A-A)

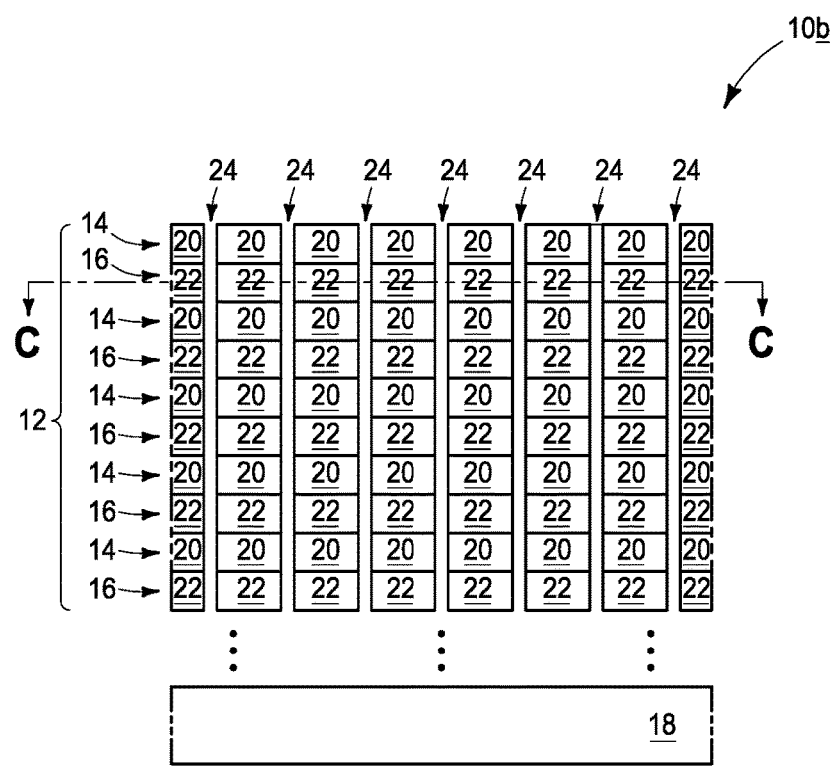
FIG. 42 (B-B)

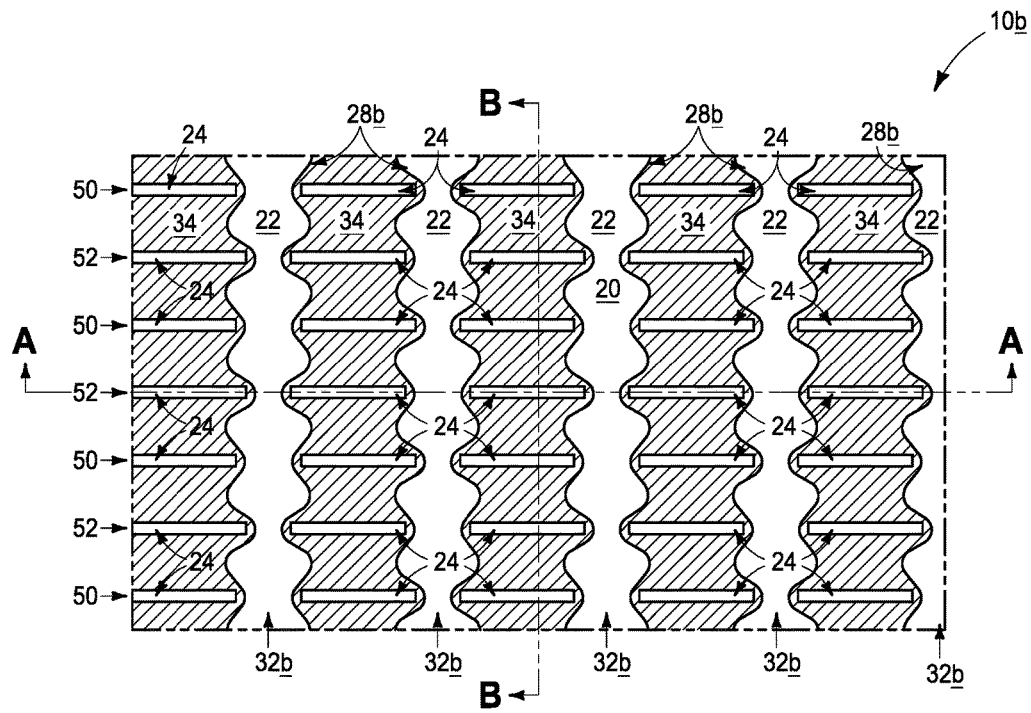
FIG. 43 (C-C)
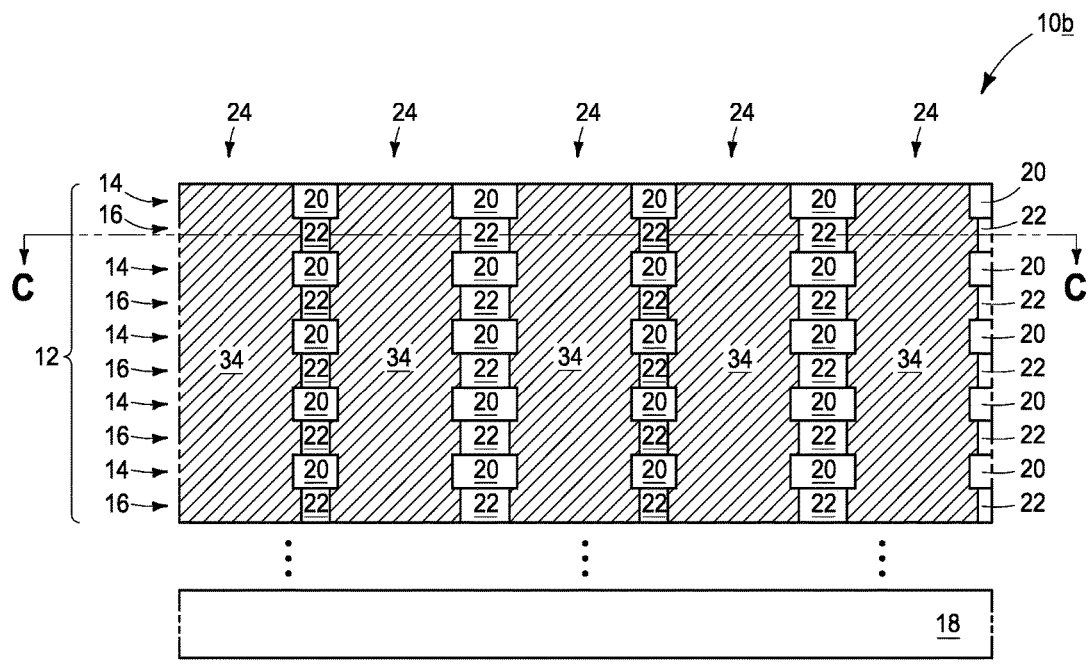
FIG. 44 (A-A)

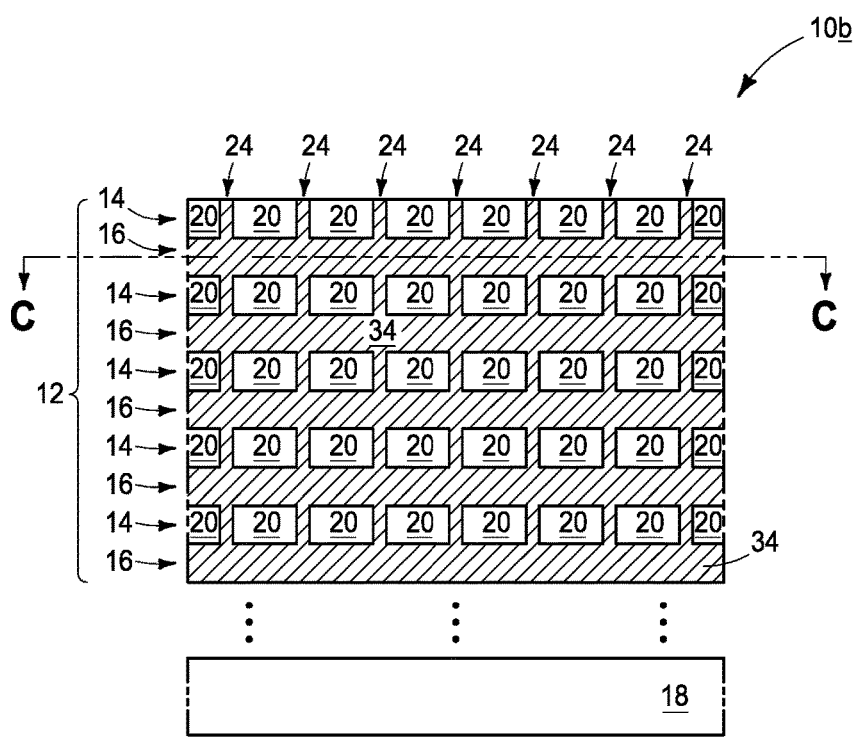
FIG. 45 (B-B)

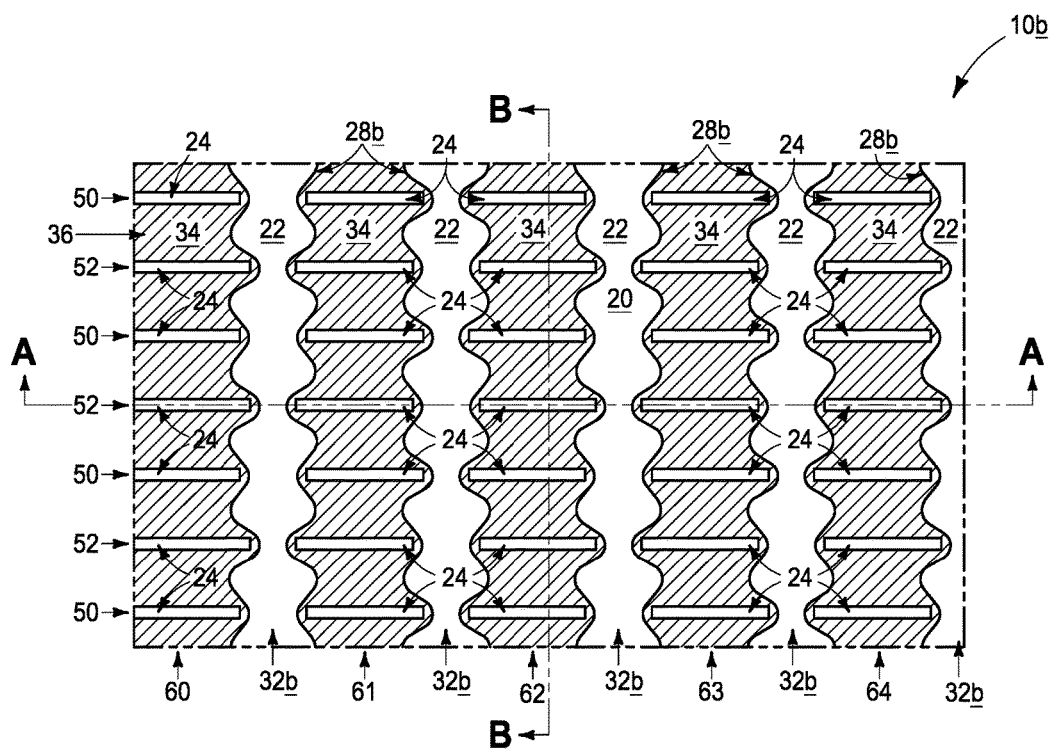
FIG. 46 (C-C)
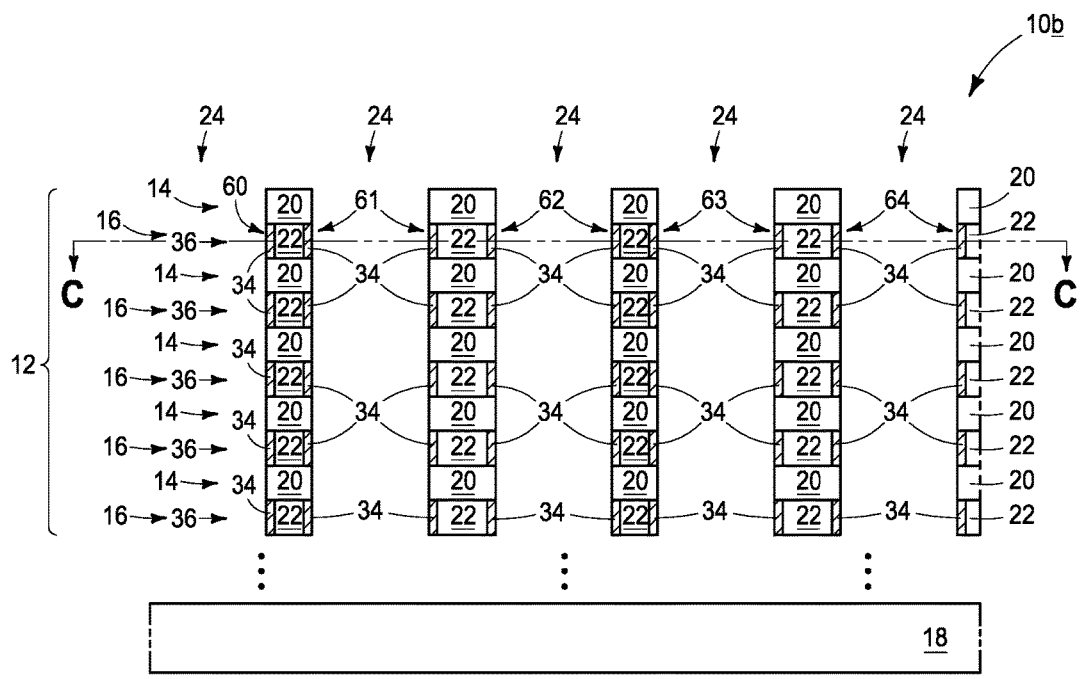
FIG. 47 (A-A)

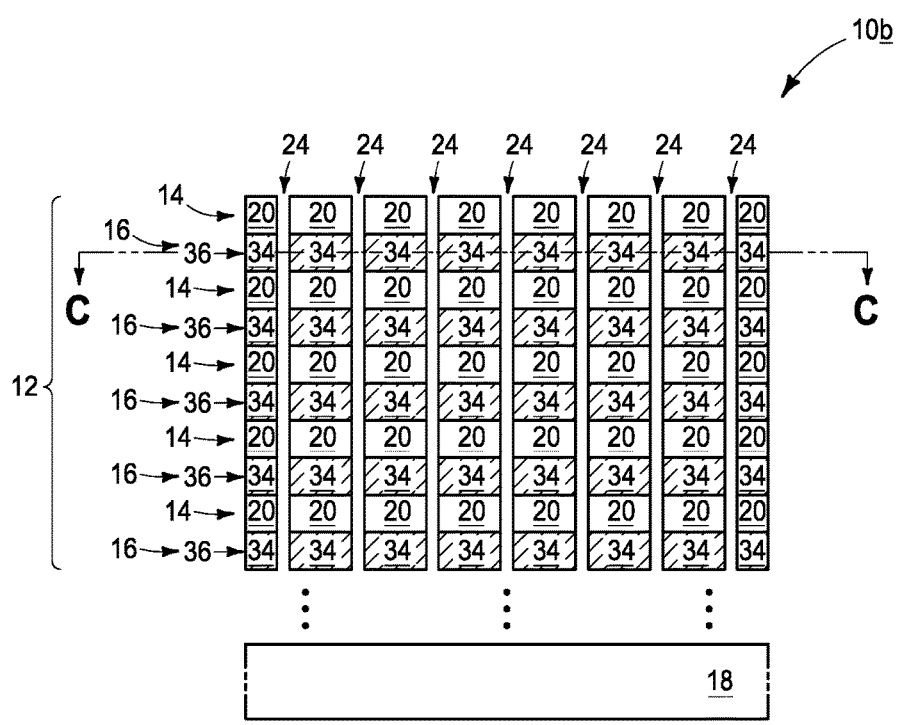
FIG. 48 (B-B)

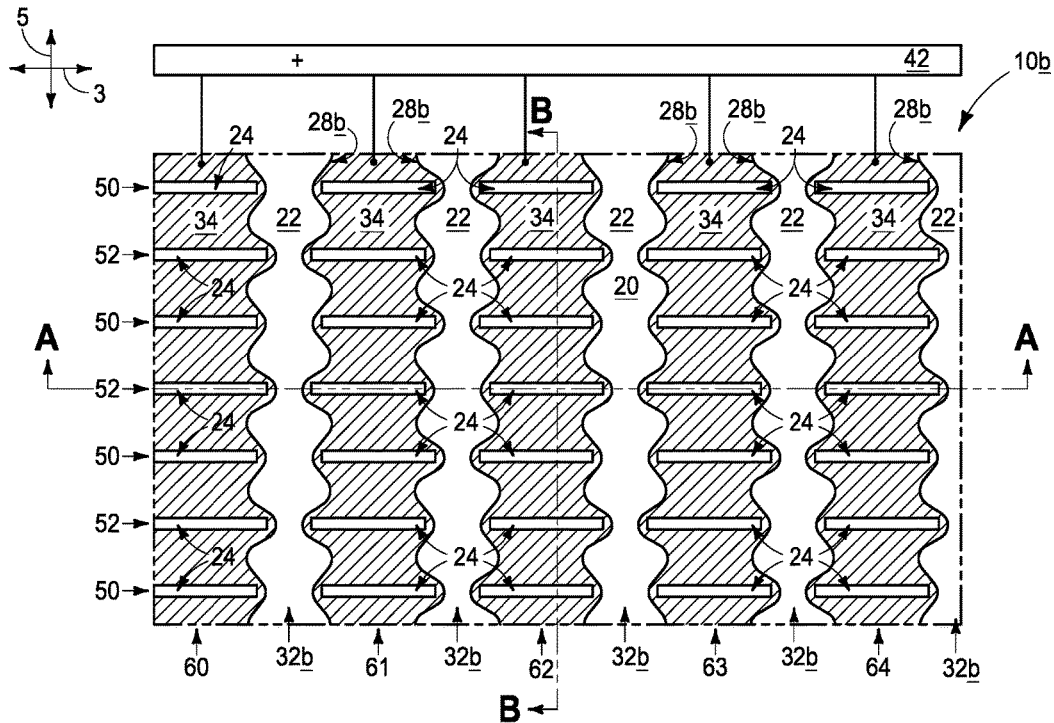
FIG. 49 (C-C)
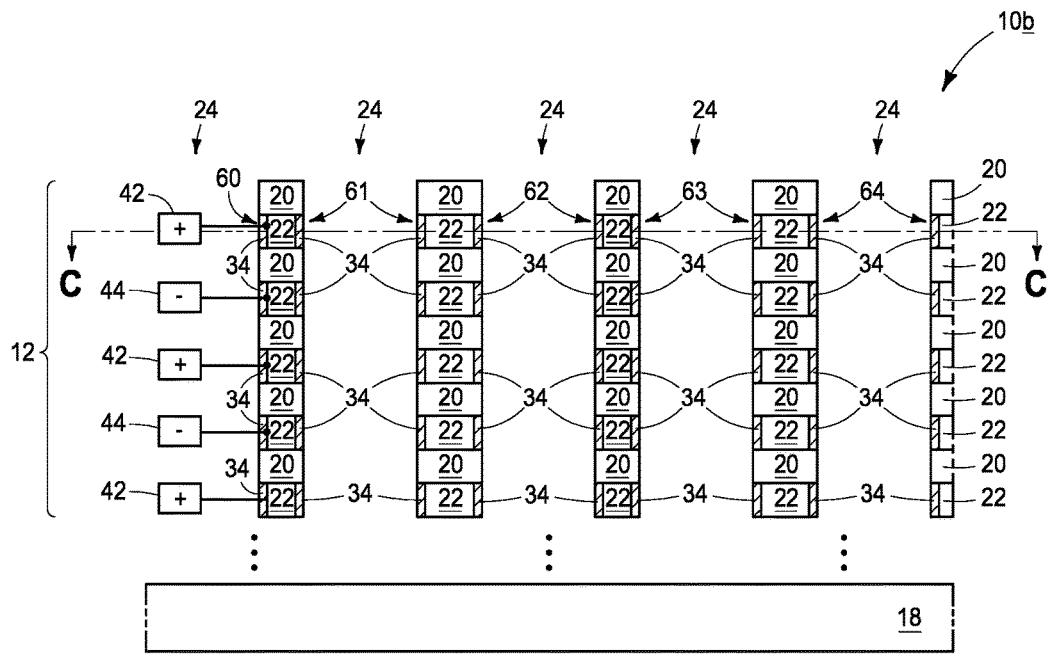
FIG. 50 (A-A)

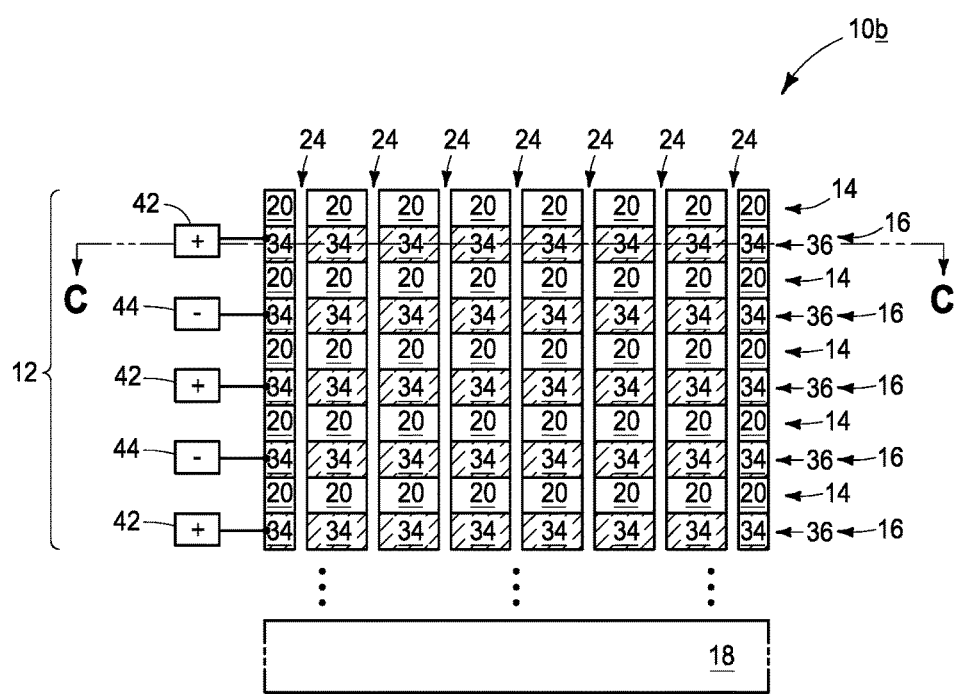
FIG. 51 (B-B)

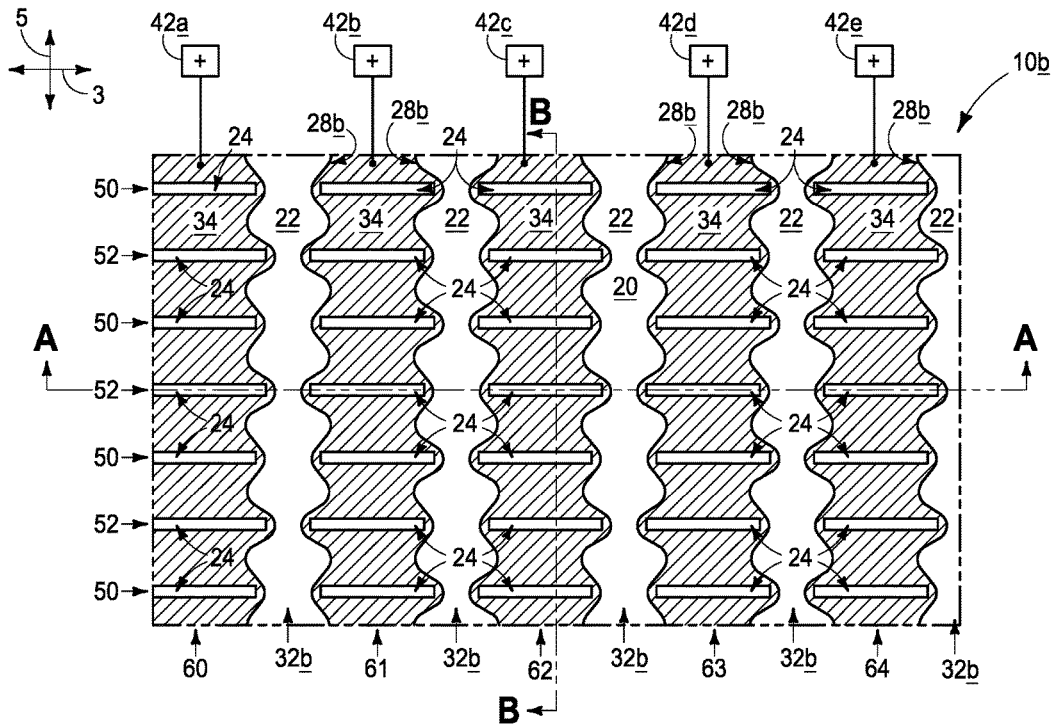
FIG. 52 (C-C)
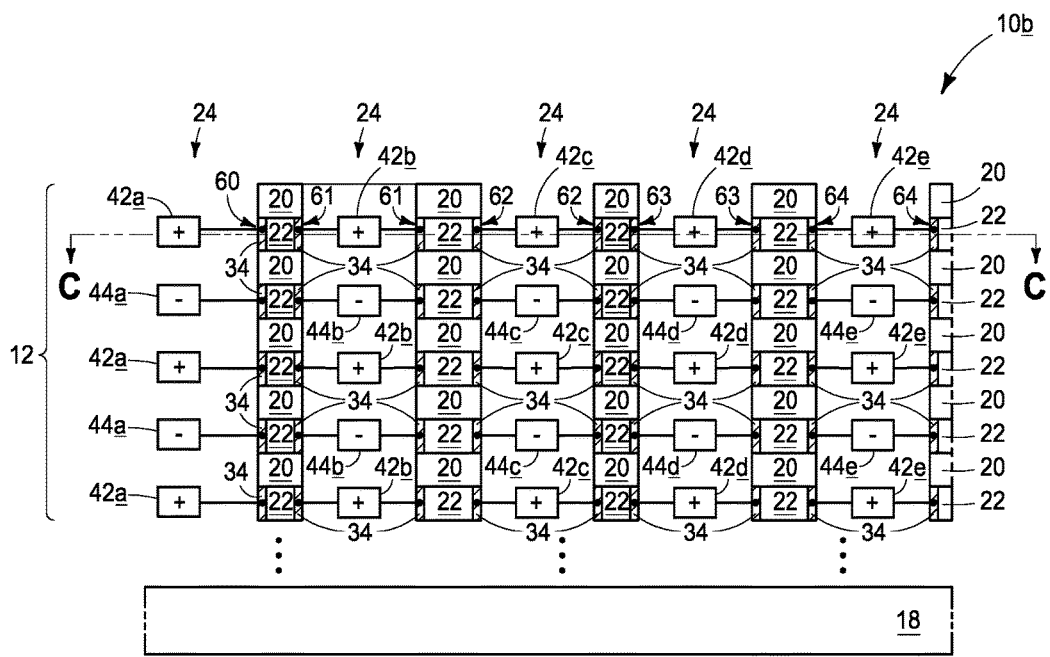
FIG. 53 (A-A)

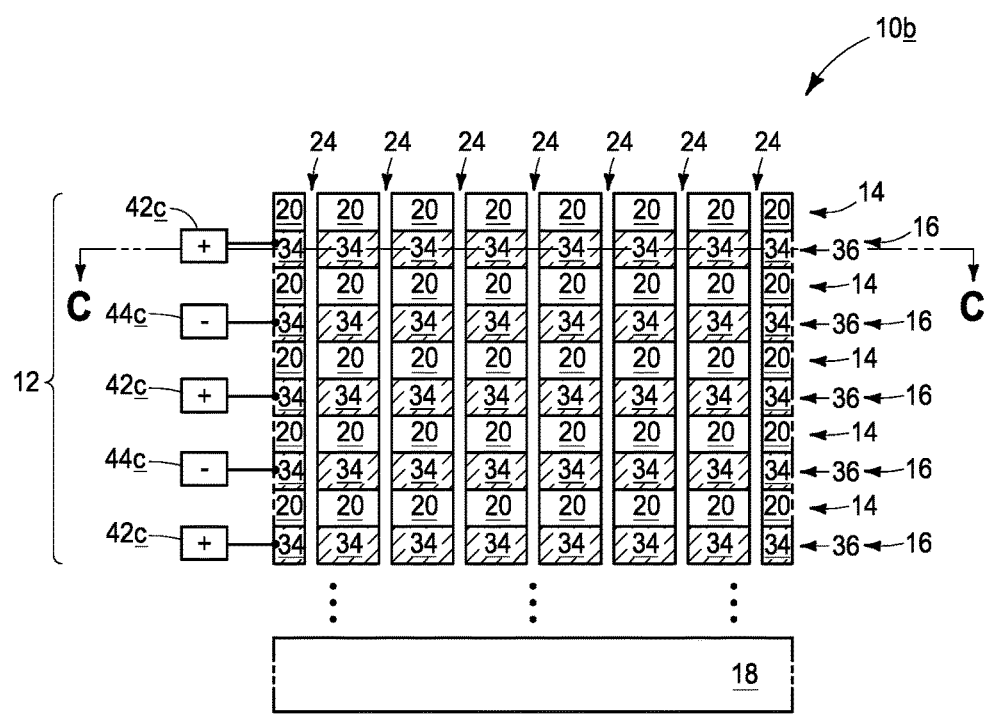
FIG. 54 (B-B)

US 10,366,901 B2

1

INTEGRATED STRUCTURES, CAPACITORS AND METHODS OF FORMING CAPACITORS

TECHNICAL FIELD

Integrated structures, capacitors and methods of forming capacitors.

BACKGROUND

Integrated circuitry may include capacitors. The capacitors may be utilized for any of a number of applications, including, for example, charge-pumps, decoupling, etc. in some applications it may be desired that the capacitors be configured to tolerate high voltages (e.g., voltages above 15 volts). It is desired to develop improved capacitors suitable for utilization in integrated circuitry, and to develop improved methods of fabricating capacitors.

BRIEF DESCRIPTION OF THE DRAWINGS

FIGS. 1-15 diagrammatically illustrate a region of a construction at process stages of an example method for fabricating example capacitors. FIGS. 1, 4, 7, 10 and 13 are top-down sectional views; and FIGS. 2, 3, 5, 6, 8, 9, 11, 12, 14 and 15 are cross-sectional side views. The views of FIGS. 1, 4, 7, 10 and 13 are along the lines C-C of FIGS. 2, 3, 5, 6, 8, 9, 11, 12, 14 and 15; the views of FIGS. 2, 5, 8, 11 and 14 are along the lines A-A of FIGS. 1, 4, 7, 10 and 13; and the views of FIGS. 3, 6, 9, 12 and 15 are along the lines B-B of FIGS. 1, 4, 7, 10 and 13.

FIGS. 16-18 diagrammatically illustrate an example capacitor formed from the construction of FIGS. 13-15. The view of FIG. 16 is along the lines C-C of FIGS. 17 and 18; the view of FIG. 17 is along the line A-A of FIG. 16; and the view of FIG. 18 is along the line B-B of FIG. 16.

FIGS. 19-21 diagrammatically illustrate additional example capacitors formed from the construction of FIGS. 13-15. The view of FIG. 19 is along the lines C-C of FIGS. 20 and 21; the view of FIG. 20 is along the line A-A of FIG. 19; and the view of FIG. 21 is along the line B-B of FIG. 19.

FIGS. 22-36 diagrammatically illustrate a region of a construction at process stages of another example method for fabricating example capacitors. A process stage of FIGS. 22-24 may follow that of FIGS. 1-3. FIGS. 22, 25, 28, 31 and 34 are top-down sectional views; and FIGS. 23, 24, 26, 27, 29, 30, 32, 33, 35 and 36 are cross-sectional side views. The views of FIGS. 22, 25, 28, 31 and 34 are along the lines C-C of FIGS. 23, 24, 26, 27, 29, 30, 32, 33, 35 and 36; the views of FIGS. 23, 26, 29, 32 and 35 are along the lines A-A of FIGS. 22, 25, 28, 31 and 34; and the views of FIGS. 24, 27, 30, 33 and 36 are along the lines B-B of FIGS. 22, 25, 28, 31 and 34.

FIGS. 37-48 diagrammatically illustrate a region of a construction at process stages of another example method for fabricating example capacitors. A process stage of FIGS. 37-39 may follow that of FIGS. 1-3. FIGS. 37, 40, 43 and 46 are top-down sectional views; and FIGS. 38, 39, 41, 42, 44, 45, 47 and 48 are cross-sectional side views. The views of FIGS. 37, 40, 43 and 46 are along the lines C-C of FIGS. 38, 39, 41, 42, 44, 45, 47 and 48; the views of FIGS. 38, 41, 44 and 47 are along the lines A-A of FIGS. 37, 40, 43 and 46; and the views of FIGS. 39, 42, 45 and 48 are along the lines B-B of FIGS. 37, 40, 43 and 46.

FIGS. 49-51 diagrammatically illustrate an example capacitor formed from the construction of FIGS. 46-48. The view of FIG. 49 is along the lines C-C of FIGS. 50 and 51; the view of FIG. 50 is along the line A-A of FIG. 49; and the view of FIG. 51 is along the line B-B of FIG. 49.

FIGS. 52-54 diagrammatically illustrate additional example capacitors formed from the construction of FIGS. 46-48. The view of FIG. 52 is along the lines C-C of FIGS. 53 and 54; the view of FIG. 53 is along the line A-A of FIG. 52; and the view of FIG. 54 is along the line B-B of FIG. 52.

DETAILED DESCRIPTION OF THE ILLUSTRATED EMBODIMENTS

In some applications, vertically-stacked memory cells (e.g. NAND memory cells of a three-dimensional NAND memory array) may be fabricated utilizing gate replacement methodology. Specifically, alternating insulative materials are formed in a stack, and then one of the insulative materials is replaced with conductive material (for instance, metal-containing material). Regions of the conductive material may become control gates of vertically-stacked memory cells. The memory cells may be within a memory array (e.g., the NAND memory array), and it may be desired to form capacitors in a region peripheral to the memory array. In some embodiments the capacitors are formed utilizing methods analogous to the gate replacement methodology so that common materials and process steps may be utilized for fabricating the capacitors peripheral to the memory array as are utilized for fabricating memory cells of the memory array. Such may reduce costs, fabrication steps, and process time as compared to conventional methods for fabricating capacitors peripheral to a memory array.

In some aspects a stack of alternating first and second insulative materials may be formed, and then the first insulative material may be removed and replaced with conductive material to thereby form a capacitive stack of alternating conductive plates and insulative material. The conductive plates of the capacitive stack may be coupled with circuitry of appropriate polarity to incorporate the capacitive stack into one or more capacitors. A difficulty that may be encountered during the removal of the first insulative material is that such will remove support from between levels of the remaining second insulative material, and accordingly such levels may collapse before conductive material is formed between the levels to complete the capacitive stack. Some embodiments include methods which remove only some of the first insulative material to leave insulative pillars which may support remaining levels of the second insulative material to avoid the problematic collapse. Some embodiments include integrated capacitive configurations which include alternating insulative levels and conductive levels; and which include insulative pillars extending through the conductive levels. Example embodiments are described with reference to FIGS. 1-54.

Referring to FIGS. 1-3, a construction 10 is shown to comprise a stack 12 of alternating first levels 14 and the second levels 16. The stack 12 is supported by a base 18.

The first levels 14 comprise first insulative material 20 and the second levels 16 comprise second insulative material 22; with the first and second insulative materials being compositionally different from one another. In some embodiments one of the first and second insulative materials 20 and 22 may comprise, consist essentially of, or consist of silicon dioxide; and the other of the first and second insulative materials 20 and 22 may comprise, consist essentially of, or consist of silicon nitride. For instance, in some embodiments the first insulative material 20 comprises silicon dioxide and the second insulative material 22 comprises silicon nitride.

The levels 14 and 16 may have any suitable thicknesses; and in some embodiments may have thicknesses within a range of from about 5 nanometers (nm) to about 300 nm. The levels 14 and 16 have the same thickness as one another in some embodiments, and may have different thicknesses relative to one another in other embodiments.

The illustrated stack 12 comprises ten alternating levels (14 and 16); but in other embodiments the stack 12 may comprise any suitable number of alternating levels. For instance, in some embodiments the stack 12 may be an extension of stacked materials utilized for fabricating a NAND memory array; with the second insulative material 22 of the second levels 16 ultimately being replaced with conductive material utilized for control gates of NAND memory cells. In such embodiments there may be an appropriate number of the second levels 16 to fabricate a desired number of vertically-stacked NAND memory cells in the NAND memory array. For instance, there may be eight of the second levels, 16 of the second levels, 32 of the second levels, 64 of the second levels, 128 of the second levels, etc.; and the associated number of first levels 14 alternating with the second levels 16 throughout the stack 12.

The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base 12 may correspond to a semiconductor substrate containing one or more materials associated with integrated circuit fabrication. Such materials may include, for example, one or more of refractory metal materials, barrier materials, diffusion materials, insulator materials, etc. A gap is provided between base 18 and stack 12 to indicate that there may be additional materials and/or structures provided between the base 18 and the stack 12 in some embodiments. In other embodiments the stack 12 may be directly against the base 18.

Referring to FIGS. 4-6, slots 24 are formed to extend through the stack 12. The slots 24 may be formed with any suitable methodology including, for example, utilization of a patterned mask (not shown) to define locations of the slots, followed by one or more suitable etches to form the slots through the stack 12, and subsequent removal of the patterned mask to leave the construction of FIGS. 4-6.

Each of the slots has a pair of ends 25 and 27, and a central region 29 between the ends 25 and 27 (the ends 25 and 27 and central region 29 are labeled for one of the slots in the view of FIG. 4).

The slots 24 are arranged in rows 30. The slots within a same row as one another are spaced from one another by a lateral distance 31 (shown between two adjacent slots in the view of FIG. 4); and neighboring slots within different rows are spaced from one another by a longitudinal distance 33 (shown between two neighboring slots in the view of FIG. 4). The distances 31 and 33 may be any suitable distances. For instance, the lateral distances 31 may be larger than the longitudinal distances 33 so that a subsequent etch of second material 22 (described below with reference to FIGS. 7-9), removes all of the second material 22 between slots along the longitudinal direction, and only removes some of the second material between slots along the lateral direction. In some embodiments the distance 31 may be within a range of from about 20 nm to about 200 nm, and the distance 33 may be within a range of from about 20 nm to about 200 nm.

The slots 24 within each of the rows 30 are laterally aligned with the slots 24 in the other rows 30 to within reasonable tolerances of fabrication and measurement. Such is in contrast to embodiments described below (specifically, embodiments shown in FIGS. 22-24 and FIGS. 37-39) in which slots from some rows are laterally offset relative to slots from other rows.

Referring to FIGS. 7-9, construction 10 is exposed to etchant (not shown) which migrates into slots 24 and selectively removes the second insulative material 22 relative to the first insulative material 20. The removal of the second insulative material 22 may be referred to as exhumation of the second insulative material, and forms voids 26 within the second levels 16. The exhumation of the second insulative material 22 only partially removes the second insulative material, and leaves portions of the second insulative material 22 remaining as insulative pillars 28 which support the first levels 16 of stack 12 so that such first levels do not collapse. The insulative pillars 28 are formed proximate the ends 25/27 (labeled in FIG. 4) of the slots 24.

The lateral distance 31 between adjacent slots 24 is shown in FIG. 7, as is the longitudinal distance 33 between neighboring slots 24. In the shown embodiment, the longitudinal distance 33 is less than the lateral distance 31 such that the etching exhumes all of the second insulative material 22 from between neighboring slots that are in different rows relative to one another, but does not exhume all of the second insulative material 22 from between adjacent slots 24 that are in the same row as one another. Accordingly, longitudinally-aligned pedestals 28 connect with one another to form walls 32 extending longitudinally across the second levels 16. In some embodiments the distances 31 between adjacent slots 24 in the same row as one another may be too close to form the illustrated continuous walls 32, and instead individual pedestals 28 may be separated from one another by intervening spaces.

In the illustrated embodiment of FIG. 7, the walls 32 have substantially diamond-shaped regions corresponding to the insulative pedestals 28. In other embodiments the pedestals 28 may have other configurations.

In the shown embodiment, the slots 24 extend primarily along a first direction designated by an axis 3 (shown adjacent the top-down view of FIG. 7), and the walls 32 extend primarily along a second direction designated by an axis 5 (shown adjacent the top-down view of FIG. 7), with the second direction being substantially orthogonal to the first direction. The term "substantially orthogonal" means that the first and second directions are orthogonal to one another to within reasonable tolerances of fabrication and measurement.

Referring to FIGS. 10-12, conductive material 34 is deposited within the voids 26 of the second levels 16. The conductive material 34 may be deposited by flowing suitable precursor through the slots 24 and into the voids 26 utilizing chemical vapor deposition (CVD), plasma vapor deposition (PVD), atomic layer deposition (ALD) or any other suitable methodology. The deposited material 34 fills the slots 24 in the illustrated embodiment, and thus forms a continuous conductive mass extending across all of the levels 16 of stack 12 as shown in the cross-section of FIG. 12.

The conductive material 34 may comprise any suitable material, such as, for example, one or more of various metals (e.g., tungsten, titanium, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments the conductive material 34 may comprise, consist essentially of, or consist of one or more of tungsten, titanium, tungsten nitride and titanium nitride.

Referring to FIGS. 13-15, the slots 24 are reopened with appropriate patterning and etching to thereby establish plates 36 of the conductive material 34 within the second levels 16. In the illustrated embodiment, the walls 32 of second insulative material 22 pattern the plates 36 into panels; with example panels 38-40 being labeled relative to the uppermost level 16 in FIGS. 13 and 14. In other embodiments, the insulative pillars 22 may be spaced-apart structures which do not form the continuous walls 32, and in such embodiments the conductive plates 36 at each of the levels 16 may be a continuous sheet wrapping around the insulative pillars 28 rather than being subdivided into panels.

In some embodiments the configuration of FIGS. 13-15 may be considered to comprise an insulative frame over the semiconductor base 18; with the insulative frame comprising vertically-spaced sheets of first insulative material 20 of levels 14, and pillars 28 of second insulative material between the vertically spaced sheets. The conductive plates 36 are between the vertically-spaced sheets and directly against the pillars 28.

The stack 12 having conductive levels 16 alternating with insulative levels 14 may be incorporated into capacitors as described with reference to FIGS. 16-21.

Referring to FIGS. 16-18, each of the conductive levels within the stack 12 is coupled to either a conductive node 42 of a first polarity (indicated as "+") or a conductive node 44 of a second polarity (indicated as "−"). Although the illustrated stack has three conductive levels at positive (+) polarity and two conductive levels at negative (−) polarity, it is to be understood that the stack may have more than the illustrated number conductive levels; and it may be desired for the number of conductive levels having negative polarity to match the number of conductive levels having positive polarity.

The conductive levels of stack 12 may be all incorporated into a single capacitive unit, as shown in FIGS. 16-18. Further, each of the panels within a conductive level (for instance, the panels 38-40 within the conductive level shown in FIG. 16) may be electrically coupled with one another and coupled to a common electrical node (for instance, the node 42 coupled with the panels 38-40) so that the panels operate together as a single conductive unit. In other embodiments, the conductive levels within stack 12 may be subdivided amongst two or more capacitive units which are operated independently relative to one another; and/or the panels within a conductive level may be subdivided amongst two or more capacitive units which are operated independently relative to one another. For instance, FIGS. 19-21 show an embodiment in which the panels 38-40 are each coupled with different nodes 42*a-c* or 44*a-c*; and in which some of the regions of the conductive levels 16 coupled with nodes 42*a* and 44*a* are part of a capacitive unit 45, and others of the regions of the conductive levels 16 coupled with the nodes 42*a* and 44*a* are part of a separate capacitive unit 46. Although the capacitive unit 46 is shown comprising three conductive levels (two conductive levels of "+" polarity and one conductive level of "−" polarity), the capacitive unit may have any suitable number of conductive levels; and may have an even number of conductive levels so that there are an equal number of conductive levels at "+" polarity as there are at "−" polarity.

Although the embodiment of FIGS. 19-20 shows each of the panels 38-40 within a conductive level being electrically coupled to a different node (42*a-c*), in other embodiments only some of the panels may be coupled to different electrical nodes, and others of the panels may be electrically coupled with one another. Further, although each of the panels 38-40 within a conductive level is coupled to a node having a common polarity (+ in the embodiment of FIG. 19), in other embodiments at least one of the panels of a conductive level may be coupled to a node having a different polarity than at least one other of the panels of the conductive level.

Although slots 24 are shown empty (i.e., filled with air or other gas) in the example constructions of FIGS. 16-20, it is to be understood that the slots 24 may be filled with any suitable insulative composition or combination of compositions.

The embodiment of FIGS. 1-15 utilizes slots 24 which are laterally aligned with one another. In other embodiments, the slots may be provided in an arrangement such that some of the slots are laterally offset relative to others. For instance, FIGS. 22-24 show a construction 10*a* having slots 24 arranged in alternating first and second rows 50 and 52, with the slots 24 of the first rows 50 being laterally offset relative to the slots 24 of the second rows 52. In the illustrated embodiment the slots of the rows 50 are laterally offset relative to the slots of the rows 52 by a distance 51 which is greater than or equal to about one fourth of a length 53 of the slots. In other embodiments the slots of rows 52 may be offset from the slots of rows 50 by a different amount, as discussed in more detail below with reference to an embodiment of FIGS. 37-54. Also, in the shown embodiment all of the slots 24 are of substantially the same lengths and widths as one another (with the term "substantially the same" meaning the same to within reasonable tolerances of fabrication and measurement); but in other embodiments at least some of the slots may be of substantially different lengths and/or widths relative to others of the slots. The slots 24 of FIGS. 22-24 may have any suitable dimensions, including, for example, the dimensions discussed above with reference to FIGS. 4-6.

Referring to FIGS. 25-27, construction 10*a* is exposed to etchant (not shown) which migrates into slots 24 and selectively removes (i.e., exhumes) the second insulative material 22 relative to the first insulative material 20. The removal of the second insulative material 22 forms voids 26 within the second levels 16. The exhumation of the second insulative material 22 only partially removes the second insulative material, and leaves portions of the second insulative material 22 remaining as insulative pillars 28*a* which support the first levels 16 of stack 12 so that such first levels do not collapse. The pedestals 28*a* are proximate ends 54 (only some which are labeled in FIG. 25) of the slots 24.

The individual pedestals 28*a* are separated from one another by intervening spaces, and do not form walls analogous to the walls 32 of FIG. 7.

Referring to FIGS. 28-30, conductive material 34 is deposited into the voids 26 (FIGS. 25-27) of the second levels 16. The conductive material 34 may be deposited by flowing suitable precursor through the slots 24 and into the voids 26 (FIGS. 25-27) utilizing CVD, PVD, ALD or any other suitable methodology. The deposited material 34 fills the slots 24 in the illustrated embodiment, and thus forms a continuous conductive mass extending across all of the levels 16 of stack 12, as shown in the cross-section of FIG. 30.

The conductive material 34 may comprise any of the materials described above with reference to FIGS. 10-12.

Referring to FIGS. 31-33, the slots 24 are reopened with appropriate patterning and etching to thereby establish plates 36 of the conductive material 34 within the second levels 16. In the illustrated embodiment the conductive plates 36 at each of the levels 16 are a continuous sheet wrapping around the insulative pillars 28*a*.

In some embodiments the configuration of FIGS. 31-33 may be considered to comprise an insulative frame over the semiconductor base 18; with the insulative frame comprising vertically-spaced sheets of first insulative material 20 of levels 14, and pillars 28*a* of second insulative material between the vertically spaced sheets. The conductive plates 36 are between the vertically-spaced sheets and directly against the pillars 28*a*. In some embodiments, additional supports (for instance, bridges) may be provided to connect islands of material 22 to one another to thereby improve the support of oxide layers 20 and alleviate sag which may otherwise occur.

The stack 12 having conductive levels 16 alternating with insulative levels 14 may be incorporated into capacitors as described with reference to FIGS. 34-36. Specifically, each of the conductive levels within the stack 12 is coupled to either a conductive node 42 of the polarity (+) or a conductive node 44 of the second polarity (−).

The conductive levels of stack 12 may be all incorporated into a single capacitive unit, as shown in FIGS. 34-36; or the conductive levels within stack 12 may be subdivided amongst two or more capacitive units which are operated independently relative to one another.

Although slots 24 are shown empty (i.e., filled with air or other gas) in the embodiment of FIGS. 34-36, it is to be understood that the slots 24 may be filled with any suitable insulative composition or combination of compositions.

Another embodiment is described with reference to FIGS. 37-54. FIGS. 37-39 show a construction 10*b* having slots 24 arranged in alternating first rows 50 and second rows 52, with the slots 24 of the first rows 50 being laterally offset relative to the slots 24 of the second rows 52. The slots of the rows 50 are laterally offset relative to the slots of rows 52 by a distance 51 which less than one fourth of the length 53 of the slots. In the shown embodiment all of the slots 24 are of substantially the same lengths and widths as one another, but in other embodiments at least some of the slots may be of substantially different lengths and/or widths relative to others of the slots. The slots 24 of FIGS. 37-39 may have any suitable dimensions, including, for example, the dimensions discussed above with reference to FIGS. 4-6.

Referring to FIGS. 40-42, construction 10*b* is exposed to etchant (not shown) which migrates into slots 24 and selectively removes (i.e., exhumes) the second insulative material 22 relative to the first insulative material 20. The removal of the second insulative material 22 forms voids 26 within the second levels 16. The exhumation of the second insulative material 22 only partially removes the second insulative material, and leaves portions of the second insulative material 22 remaining as insulative pillars 28*b* which support the first levels 16 of stack 12 so that such first levels do not collapse. The pedestals 28*b* form walls 32*b*.

In the shown embodiment, the slots 24 extend primarily along the first direction designated by axis 3 (shown adjacent the top-down view of FIG. 40), and the walls 32 extend primarily along the second direction designated by axis 5 (shown adjacent the top-down view of FIG. 40), with the second direction being substantially orthogonal to the first direction.

Referring to FIGS. 43-45, conductive material 34 is deposited into the voids 26 (FIGS. 40-42) of the second levels 16. The conductive material 34 may be deposited by flowing suitable precursor through the slots 24 and into the voids 26 (FIGS. 40-42) utilizing CVD, PVD, ALD or any other suitable methodology. The deposited material 34 fills the slots 24 in the illustrated embodiment, and thus forms a continuous conductive mass extending across all of the levels 16 of stack 12, as shown in the cross-section of FIG. 45.

The conductive material 34 may comprise any of the materials described above with reference to FIGS. 10-12.

Referring to FIGS. 46-48, the slots 24 are reopened with appropriate patterning and etching to thereby establish plates 36 of the conductive material 34 within the second levels 16. In the illustrated embodiment the walls 32*b* of second insulative material 22 pattern the plates 36 into panels; with example panels 60-64 being labeled relative to the uppermost level 16 in FIGS. 46 and 47. The panels 60-64 are electrically isolated from one another by the walls 32*b*.

In some embodiments the configuration of FIGS. 46-48 may be considered to comprise an insulative frame over the semiconductor base 18; with the insulative frame comprising vertically-spaced sheets of first insulative material 20 of levels 14, and pillars 28*b* of second insulative material between the vertically spaced sheets. The conductive plates 36 are between the vertically-spaced sheets and directly against the pillars 28*b*.

The stack 12 having conductive levels 16 alternating with insulative levels 14 may be incorporated into capacitors as described with reference to FIGS. 49-54.

Referring to FIGS. 49-51, each of the conductive levels within the stack 12 is coupled to either a conductive node 42 of the first polarity (+) or a conductive node 44 of the second polarity (−).

The conductive levels of stack 12 may be all incorporated into a single capacitive unit, as shown in FIGS. 49-51; with each of the panels within a conductive level (for instance, the panels 60-64 within the conductive level shown in FIG. 49) being electrically coupled with one another and electrically coupled to a common electrical node (for instance, the node 42 coupled with the panels 60-64). In other embodiments, the conductive levels within stack 12 may be subdivided amongst two or more capacitive units which are operated independently relative to one another; and/or the panels within a conductive level may be subdivided amongst two or more capacitive units which are operated independently relative to one another. For instance, FIGS. 52-54 show an embodiment in which the panels 60-64 are each coupled with different nodes 42*a-e*; and in which such pattern extends through all of the levels 16 of stack 12.

Although the embodiment of FIGS. 52-54 shows each of the panels 60-64 within a conductive level as being electrically coupled to a different node (42*a-e*), in other embodiments only some of the panels may be coupled to different electrical nodes, and others of the panels may be electrically coupled with one another. Further, although each of the panels 60-64 within a conductive level is coupled to a node having a common polarity (+ in the embodiment of FIG. 52), in other embodiments at least one of the panels of a conductive level may be coupled to a node having a different polarity than at least one other of the panels of the conductive level.

Although slots 24 are shown empty (i.e., filled with air or other gas) in the embodiments of FIGS. 49-54, it is to be understood that the slots 24 may be filled with any suitable insulative composition or combination of compositions.

The conductive levels 16 of the capacitors described herein may be electrically coupled with conductive nodes (e.g., nodes 42 of first polarity and nodes 44 of second polarity) with any suitable architecture, such as, for example, staircase architecture, shark jaw architecture, etc. In some embodiments, the capacitors described herein may be integrated into a die comprising three-dimensional NAND, and may be formed simultaneously with regions of the NAND using the same process steps that are used for gate replacement methodology during fabrication of the NAND.

The structures described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections (unless indicated otherwise) in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include a capacitor. The capacitor includes a stack of alternating first and second levels. The first levels comprise only insulative material, and the second levels comprise insulative pillars extending through conductive material. Slots extend through the stack. Individual slots have a pair of ends and a central region between the ends. The insulative pillars within the second levels are proximate the ends of the slots. The insulative pillars are of a different composition than the insulative material of the first levels.

Some embodiments include an integrated structure which includes a semiconductor base and an insulative frame over the semiconductor base. The insulative frame has vertically-spaced sheets of first insulative material, and pillars of second insulative material between the vertically-spaced sheets. The first and second insulative materials are different from one another. Conductive plates are between the vertically-spaced sheets and are directly against the insulative pillars.

Some embodiments include a method of forming a capacitor. A stack of alternating first and second levels is formed. The first levels comprise first insulative material and the second levels comprise second insulative material. The second insulative material is compositionally different from the first insulative material. Slots are formed to extend through the stack. Individual slots have a pair of ends and a central region between the ends. The second insulative material is exhumed with etchant provided in the slots to form voids within the second levels. The exhuming only removes some of the second insulative material to leave a remainder of the second insulative material as insulative pillars within the second levels and proximate the ends of the slots. The voids are filled with conductive material, and the conductive material is formed into conductive plates within the second levels.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A capacitor comprising:
   a stack of alternating first and second levels supported by a base; the first levels comprising only insulative material, and the second levels comprising insulative pillars extending through conductive material;
   a plurality of slots extending through the stack; each of the slots comprised by the plurality of slots having a first end and an opposing second end with a central region between the first and second ends; the plurality of slots being arranged in multiple rows with the second ends of within a first row being spaced from the first ends of slots in a second row by a lateral distance; and
   the insulative pillars within the second levels being within the lateral distance between rows of slots, the insulative pillars being of a different composition than the insulative material of the first levels.

2. The capacitor of claim 1 wherein the insulative pillars comprise silicon nitride; and wherein the insulative material of the first levels comprises silicon dioxide.

3. The capacitor of claim 1 wherein the slots extend along a first direction, and wherein the insulative pillars form walls extending along a second direction substantially orthogonal to the first direction; the walls subdividing the conductive material within each of the second levels into panels.

4. The capacitor of claim 3 wherein at least some of the panels of one of the second levels are electrically coupled with one another.

5. The capacitor of claim 3 wherein all of the panels of one of the second levels are electrically coupled with one another.

6. The capacitor of claim 3 wherein at least some of the panels of one of the second levels are not electrically coupled with one another.

7. The capacitor of claim 3 wherein none of the panels of one of the second levels are electrically coupled with one another.

8. The capacitor of claim 3 wherein the walls have substantially diamond shaped regions.

9. The capacitor of claim 1 wherein the conductive material of the second levels comprises metal.

10. The capacitor of claim 1 wherein the conductive material of the second levels comprises one or more of tungsten, titanium, tungsten nitride and titanium nitride.

11. The capacitor of claim 1 wherein the conductive material of each of the second levels is a continuous sheet wrapping around the insulative pillars.

12. The capacitor of claim 1 integrated into circuitry on a die together with a three-dimensional NAND memory array.

* * * * *